US012482631B2

(12) United States Patent
Hirayama

(10) Patent No.: US 12,482,631 B2
(45) Date of Patent: Nov. 25, 2025

(54) PLASMA PROCESSING APPARATUS

(71) Applicant: Tokyo Electron Limited, Tokyo (JP)

(72) Inventor: Masaki Hirayama, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 75 days.

(21) Appl. No.: 18/612,075

(22) Filed: Mar. 21, 2024

(65) Prior Publication Data

US 2024/0321550 A1 Sep. 26, 2024

(30) Foreign Application Priority Data

Mar. 22, 2023 (JP) ................................. 2023-045025

(51) Int. Cl.
*H01J 37/32* (2006.01)

(52) U.S. Cl.
CPC .... *H01J 37/32082* (2013.01); *H01J 37/3244* (2013.01); *H01J 37/32522* (2013.01); *H01J 37/32541* (2013.01); *H01J 2237/002* (2013.01)

(58) Field of Classification Search
CPC ............. H01J 37/32082; H01J 37/3244; H01J 37/32522; H01J 37/32541; H01J 2237/002
See application file for complete search history.

(56) References Cited

U.S. PATENT DOCUMENTS

| | | | | |
|---|---|---|---|---|
| 2024/0071730 | A1* | 2/2024 | Hirayama | H01J 37/32623 |
| 2024/0087849 | A1* | 3/2024 | Hirayama | H01J 37/32568 |
| 2024/0242934 | A1* | 7/2024 | Hirayama | H01J 37/32229 |
| 2024/0242936 | A1* | 7/2024 | Hirayama | H01J 37/32247 |
| 2024/0321550 | A1* | 9/2024 | Hirayama | H01J 37/32724 |
| 2025/0014864 | A1* | 1/2025 | Hirayama | H01J 37/321 |

FOREIGN PATENT DOCUMENTS

| | | | | | |
|---|---|---|---|---|---|
| JP | 2008-001923 | A | | 1/2008 | |
| JP | 2024101980 | A | * | 7/2024 | |
| JP | 2025009416 | A | * | 1/2025 | H01J 37/32229 |
| KR | 10-2016-0113370 | A | | 9/2016 | |
| KR | 10-2021-0091333 | A | | 7/2021 | |
| KR | 10-2022-0132447 | A | | 9/2022 | |
| KR | 10-2023-0008604 | A | | 1/2023 | |
| WO | WO-2024154611 | A1 | * | 7/2024 | H05H 1/46 |
| WO | WO-2025013616 | A1 | * | 1/2025 | H05H 1/46 |
| WO | WO-2025126846 | A1 | * | 6/2025 | |

* cited by examiner

*Primary Examiner* — Adam D Houston
(74) *Attorney, Agent, or Firm* — Nath, Goldberg & Meyer; Jerald L. Meyer

(57) ABSTRACT

A plasma processing apparatus includes a temperature regulator, which includes a plurality of fans and provides a flow path, wherein the flow path is axially or rotationally symmetrical with respect to a central axis and includes a first partial flow path and a second partial flow path, and wherein the first partial flow path extends along an upper surface of an excitation electrode, and the second partial flow path extends alternately in opposite directions between the plurality of fans and the first partial flow path.

17 Claims, 14 Drawing Sheets

PLASMA PROCESSING APPARATUS

CROSS-REFERENCE TO RELATED APPLICATION

This application is based upon and claims the benefit of priority from Japanese Patent Application No. 2023-045025, filed on Mar. 22, 2023, the entire contents of which are incorporated herein by reference.

TECHNICAL FIELD

Exemplary embodiments of the present disclosure relate to a plasma processing apparatus.

BACKGROUND

A substrate processing apparatus used to process substrates may have a mechanism to cool components thereof. Patent Document 1 discloses a film forming apparatus that serves as a substrate processing apparatus and includes a mechanism to cool a shower head.

PRIOR ART DOCUMENT

[Patent Document]

Patent Document 1: Japanese Patent Laid-open Publication No. 2008-001923

SUMMARY

According to one embodiment of the present disclosure, there is provided a plasma processing apparatus including a chamber, a substrate support, an excitation electrode, an emitter, and a temperature regulator. The chamber provides a processing space therein. The substrate support is provided in the processing space. The excitation electrode is provided above the substrate support. The emitter is provided to emit electromagnetic waves to a plasma generation space below the excitation electrode, and extends around a central axis of the chamber and the excitation electrode. The temperature regulator is configured to supply a heat medium along an upper surface of the excitation electrode. The temperature regulator includes a plurality of fans configured to create a flow of the heat medium, and provides a flow path for the heat medium between each of the plurality of fans and the excitation electrode. The plurality of fans is arranged above the excitation electrode at equal intervals around the central axis. The flow path is axially or rotationally symmetrical with respect to the central axis. The flow path includes a first partial flow path and a second partial flow path. The first partial flow path extends along the upper surface of the excitation electrode. The second partial flow path extends alternately in opposite directions between the plurality of fans and the first partial flow path.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
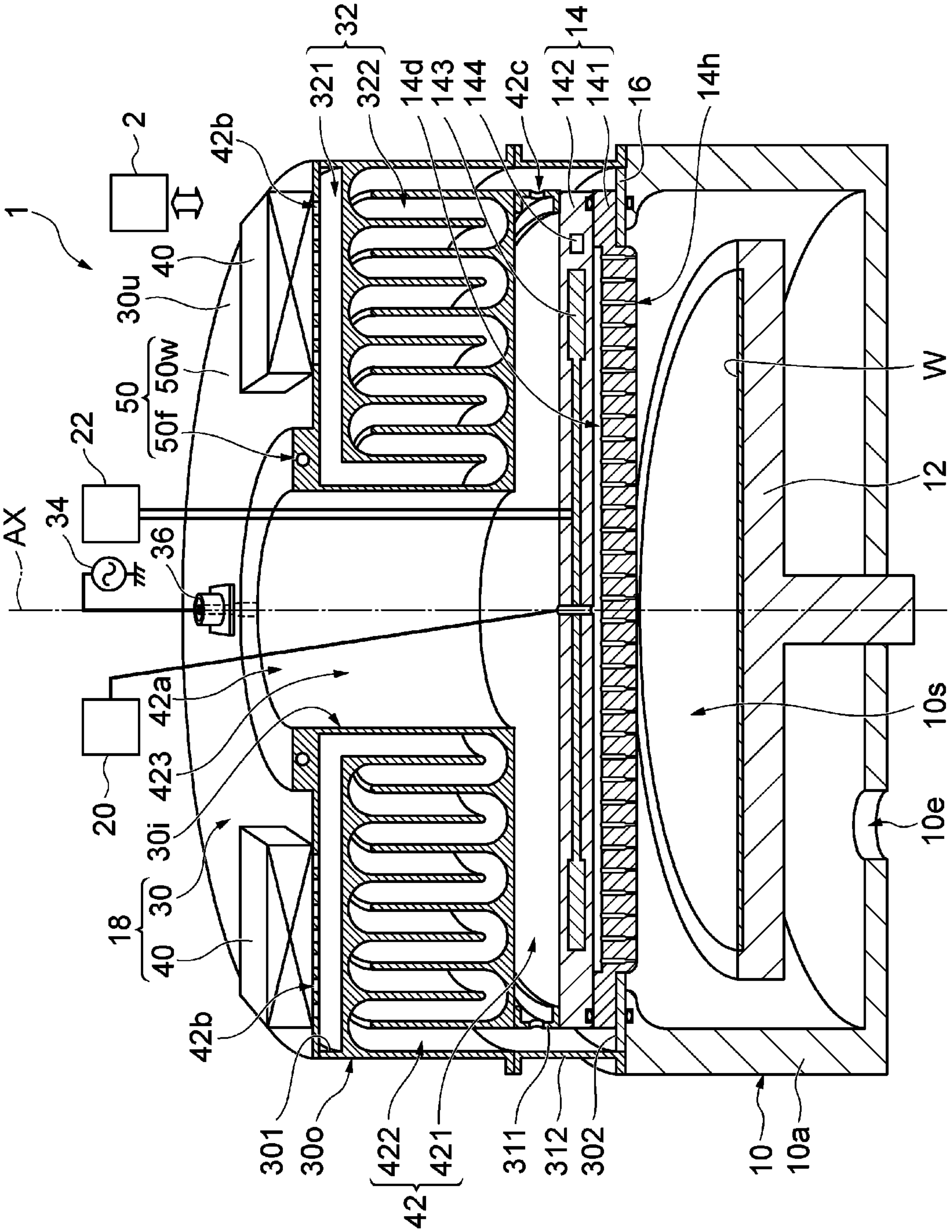
FIG. 1 is a view illustrating a plasma processing apparatus according to one exemplary embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, various exemplary embodiments will be described in detail with reference to the drawings. In addition, the same reference numerals will be given to the same or corresponding parts in each drawing.

FIG. 1 is a view illustrating a plasma processing apparatus according to one exemplary embodiment. A plasma processing apparatus 1 illustrated in FIG. 1 includes a chamber 10, a substrate support 12, an excitation electrode 14, an emitter 16, and a temperature regulator 18. The plasma processing apparatus 1 may further include a controller 2.

The chamber 10 provides a processing space **10*s* therein. In the plasma processing apparatus 1, a substrate W is processed in the processing space 10*s*. The chamber 10 is made of a metal such as aluminum and is grounded. The chamber 10 has a sidewall 10*a*, and is open at an upper end thereof. The chamber 10 and the sidewall 10*a* may have a substantially cylindrical shape. The processing space 10*s* is provided inside the sidewall 10*a*. A central axis of each of the chamber 10, the sidewall 10*a*, and the processing space 10*s* is an axis AX. The chamber 10** may have a corrosion-resistant film on a surface thereof. The corrosion-resistant film may be an yttrium oxide film, an yttrium oxide fluoride film, an yttrium fluoride film, or a ceramic film containing yttrium oxide or yttrium fluoride.

A bottom of the chamber 10 provides an exhaust port **10*e*. An exhaust device is connected to the exhaust port 10*e***. The exhaust device may include a vacuum pump such as a dry pump and/or a turbo molecular pump and an automatic pressure control valve.

The substrate support 12 is provided in the processing space 10*s*. The substrate support 12 is configured to substantially horizontally support the substrate W placed on an upper surface thereof. The substrate support 12 has a substantially disc shape. A central axis of the substrate support 12 is the axis AX.

The excitation electrode 14 is provided above the substrate support 12 with the processing space 10*s* interposed therebetween. The excitation electrode 14 is made of a conductive material such as a metal (e.g., aluminum) and has a substantially disc shape. A central axis of the excitation electrode 14 is the axis AX.

The emitter 16 is provided to emit electromagnetic waves therefrom into a plasma generation space. In the plasma processing apparatus 1, the plasma generation space is a space in the processing space 10*s* and below the excitation electrode 14. The electromagnetic waves emitted from the emitter 16 into the plasma generation space may be radio frequency waves such as VHF waves or UHF waves. The emitter 16 is made of a dielectric such as quartz, aluminum nitride, or aluminum oxide. The emitter 16 extends in a circumferential direction around the axis AX. The emitter 16 may have an annular shape. The emitter 16 may extend to surround the plasma generation space or a shower plate 141 to be described later. In the plasma processing apparatus 1, a gas in the chamber 10 is excited by the electromagnetic waves emitted from the emitter 16 into the plasma generation space. As a result, plasma is generated in the plasma generation space.

In one embodiment, the excitation electrode 14 may include the shower plate 141 and an upper electrode 142. The shower plate 141 is provided above the substrate support 12. The shower plate 141 closes the upper end opening of the chamber 10 in conjunction with the emitter 16. The shower plate 141 provides a plurality of gas holes 14*h*. The plurality of gas holes 14*h* extends in a thickness direction (vertical direction) of the shower plate 141 and penetrates the shower plate 141.

The upper electrode 142 is provided on the shower plate 141. The upper electrode 142 forms a gas diffusion chamber 14*d* between the shower plate 141 and the upper electrode 142. A gas supply 20 is connected to the gas diffusion chamber 14*d*. A gas from the gas supply 20 passes through the gas diffusion chamber 14*d* and is discharged from the plurality of gas holes 14*h* into the processing space 10*s*.

In one embodiment, the excitation electrode 14 may incorporate a heater 143 therein. The heater 143 may be embedded in the upper electrode 142. The heater 143 is connected to a heater power supply 22. The heater 143 generates heat upon receiving power supplied from the heater power supply 22. In addition, the plasma processing apparatus 1 may further include a temperature sensor 144. The temperature sensor 144 may be embedded in the excitation electrode 14 or the upper electrode 142. The temperature sensor 144 includes, for example, a thermocouple. The temperature sensor 144 measures a temperature of the excitation electrode 14. In the plasma processing apparatus 1, the heater power supply 22 and a plurality of fans to be described later are controlled by the controller 2 to reduce a difference between a measured temperature value from the temperature sensor 144 and a target temperature value of the excitation electrode 14.

The controller 2 is a computer device that includes a processor, a computer readable storage device such as a memory, and a communication interface. The controller 2 is configured to execute a control program to control respective components of the plasma processing apparatus 1 based on recipe data.

The plasma processing apparatus 1 may further include a resonator 30. The resonator 30 is provided above the excitation electrode 14. The resonator 30 provides a cavity 32. The cavity 32 is formed by a wall made of a conductive material such as a metal. The resonator 30 includes a first end 301 and a second end 302. The first end 301 is located above the second end 302. The first end 301 extends in the circumferential direction around the axis AX. The first end 301 is provided by an outer periphery 300 of the resonator 30. The second end 302 is located externally to the excitation electrode 14 and is coupled to the emitter 16. The resonator 30 is configured to resonate electromagnetic waves propagating in the cavity 32 by reflecting the electromagnetic waves at the first end 301 and the second end 302. The electromagnetic waves resonated in the resonator 30 are supplied from the second end 302 to the emitter 16, thus being emitted into the plasma generation space.

The cavity 32 of the resonator 30 is configured to be axially or rotationally symmetrical with respect to the axis AX. The cavity 32 may include an upper portion 321 and a bent portion 322. The upper portion 321 extends from the first end 301 to an inner periphery 30*i* of the resonator 30 in a direction toward the axis AX. The bent portion 322 extends from an inner end of the upper portion 321 to the second end 302. The bent portion 322 is alternately bent in opposite directions. In the plasma processing apparatus 1, the opposite directions are upward and downward. That is, the bent portion 322 meanders to extend alternately upward and downward.

The plasma processing apparatus 1 may further include a radio frequency power supply 34. The radio frequency power supply 34 is configured to generate radio frequency power. The electromagnetic waves introduced into the chamber 10 are generated based on the radio frequency power generated by the radio frequency power supply 34. The radio frequency power supply 34 may be directly connected to the resonator 30 using a coaxial line. That is, the radio frequency power supply 34 may be coupled to a waveguide of the resonator 30 without an impedance matching device. The coaxial line may include a connector 36 as a connection part to the resonator 30. The connector 36 may be connected to the resonator 30 to introduce the electromagnetic waves into the resonator 30 from the upper portion 321. In this case, an inner conductor of the connector 36 is connected to a wall defining the upper portion 321 from below, and an outer conductor of the connector 36 is connected to a wall (upper wall 30*u*) defining the upper portion 321 from above.

As described above, the plasma processing apparatus 1 includes the temperature regulator 18. The temperature regulator 18 is configured to supply a heat medium along an upper surface of the excitation electrode 14. The heat medium is air from outside the plasma processing apparatus 1. However, the heat medium may be any other gas.

The temperature regulator 18 includes a plurality of fans 40 and provides a flow path 42. The fans 40 are arranged above the excitation electrode 14 at substantially equal intervals around the axis AX. The fans 40 are configured to create a flow of the heat medium in the flow path 42. In the plasma processing apparatus 1, each of the fans 40 may suction and discharge the heat medium from the flow path 42.

The flow path 42 extends from an opening 42*a* to a plurality of openings 42*b*. The opening 42*a* serves as an inlet for the heat medium to the flow path 42. The openings 42*b* serve as an outlet for the heat medium from the flow path 42. Each of the openings 42*b* is open directly below a corresponding fan among the plurality of fans 40.

The flow path 42 is axially or rotationally symmetrical with respect to the axis AX. The flow path 42 includes a partial flow path 421 (first partial flow path) and a partial flow path 422 (second partial flow path). The flow path 42 may further include a partial flow path 423 (third partial flow path).

The partial flow path 421 extends along the upper surface of the excitation electrode 14. The partial flow path 421 extends in a radial direction from the axis AX. The partial flow path 421 is connected between the partial flow path 422 and the partial flow path 423.

The partial flow path 422 extends alternately in opposite directions between the plurality of fans 40 and the partial flow path 421. The opposite directions are upward and downward. The partial flow path 422 is connected to the partial flow path 421 via a plurality of communication holes 42*c*. The communication holes 42*c* are arranged at substantially equal intervals along the circumferential direction around the axis AX.

The partial flow path 423 extends from the opening 42*a* to the partial flow path 421 and is connected to the partial flow path 421. The partial flow path 423 is provided inward of the inner periphery 30*i* of the resonator 30. The partial flow path 423 may have the axis AX as a central axis thereof. That is, the partial flow path 423 may extend in the vertical direction to the partial flow path 421 along the axis AX.

In the plasma processing apparatus 1, the heat medium introduced from the opening 42*a* is supplied from the partial flow path 423 to the partial flow path 421 and then flows along the upper surface of the excitation electrode 14 in the partial flow path 421. As a result, heat exchange occurs between the excitation electrode 14 and the heat medium. Then, the heat medium flows from the partial flow path 421 to the partial flow path 422 and is discharged from the plurality of openings 42*b* to the outside of the plasma processing apparatus 1 by the fans 40.

The temperature regulator 18 may further include a cooler 50. The cooler 50 forms a portion of the partial flow path 422. Specifically, the cooler 50 includes a wall 50*w* forming the partial flow path 422 and provides a coolant flow path 50*f* in the wall 50*w*. A coolant is supplied from a chiller unit to the coolant flow path 50*f*. With the temperature regulator 18, the heat medium cooled by the cooler 50 in the partial flow path 422 is discharged to the outside from the fans 40.

In the plasma processing apparatus 1, the temperature of the excitation electrode 14 may be maintained constant in both a state where plasma is generated in the chamber 10 and a state where no plasma is generated in the chamber 10. In this case, the fans 40 and the heater power supply 22 are controlled by the controller 2 so that the measured temperature value of the temperature sensor 144 becomes closer to a constant target temperature value. Specifically, in the state where no plasma is generated in the chamber 10, the fans 40 may be stopped or rotated at a low speed, and power may be supplied from the heater power supply 22 to the heater 143 to heat the excitation electrode 14 by the heater 143. In addition, in the state where the plasma is generated in the chamber 10, since the excitation electrode 14 receives input heat from the plasma, the fans 40 are rotated at a relatively high speed to cool the excitation electrode 14. Further, in the state where the plasma is generated in the chamber 10, the supply of power from the heater power supply 22 to the heater 143 may be stopped.

In one embodiment, the partial flow path 422 of the temperature regulator 18 may be formed with the cavity 32 of the resonator 30. That is, the partial flow path 422 may be formed with the upper portion 321 and the bent portion 322. In this case, the resonator 30 constitutes a heat exchanger for the excitation electrode 14. In addition, in the plasma processing apparatus 1, the partial flow path 421 is formed between the resonator 30 and the excitation electrode 14. The partial flow path 423 is formed inside the resonator 30 by the inner periphery 30*i* of the resonator 30. The wall 50*w* of the cooler 50 described above may be the upper wall 30*u* defining the upper portion 321 of the cavity 32 of the resonator 30. The upper wall 30*u* may also provide the opening 42*a* and the plurality of openings 42*b*.

In addition, the resonator 30 may further include an inner heat-insulator 311 and an outer heat-insulator 312. The inner heat-insulator 311 and the outer heat-insulator 312 partially form the cavity 32 of the resonator 30 and also partially form the partial flow path 422. The inner heat-insulator 311 and the outer heat-insulator 312 prevent heat transfer between the resonator 30 and the excitation electrode 14. Each of the inner heat-insulator 311 and the outer heat-insulator 312 has a lower thermal conductivity than thermal conductivities of other walls defining the cavity 32 of the resonator 30. Each of the inner heat-insulator 311 and the outer heat-insulator 312 may be made of a metal having a low thermal conductivity such as stainless steel. Further, each of the inner heat-insulator 311 and the outer heat-insulator 312 may include a coating made of silver, gold, copper, or rhodium to reduce a surface resistance thereof.

The inner heat-insulator 311 has a substantially cylindrical shape. The inner heat-insulator 311 is interposed between the partial flow path 421 and the partial flow path 422. The inner heat-insulator 311 provides the plurality of communication holes 42*c* described above. The outer heat-insulator 312 extends to surround the inner heat-insulator 311 and the excitation electrode 14. Portions of each of the bent portion 322 and the partial flow path 422 are formed between the outer heat-insulator 312 and the inner heat-insulator 311 and between the outer heat-insulator 312 and the excitation electrode 14.

In the plasma processing apparatus 1 described above, the flow path 42 of the temperature regulator 18 is an axially or rotationally symmetrical flow path about the axis AX. Thus, the flow path 42 is formed substantially evenly in the circumferential direction. Further, a pressure loss of the heat medium occurs at a plurality of direction-change locations in the flow path 42. Thus, uniformity of the flow of the heat medium in the flow path 42 in the circumferential direction is further enhanced. Therefore, with the plasma processing apparatus 1, the uniformity of the flow of the heat medium, which is for adjusting the temperature of the excitation electrode 14, in the circumferential direction is increased.

Figure 2:
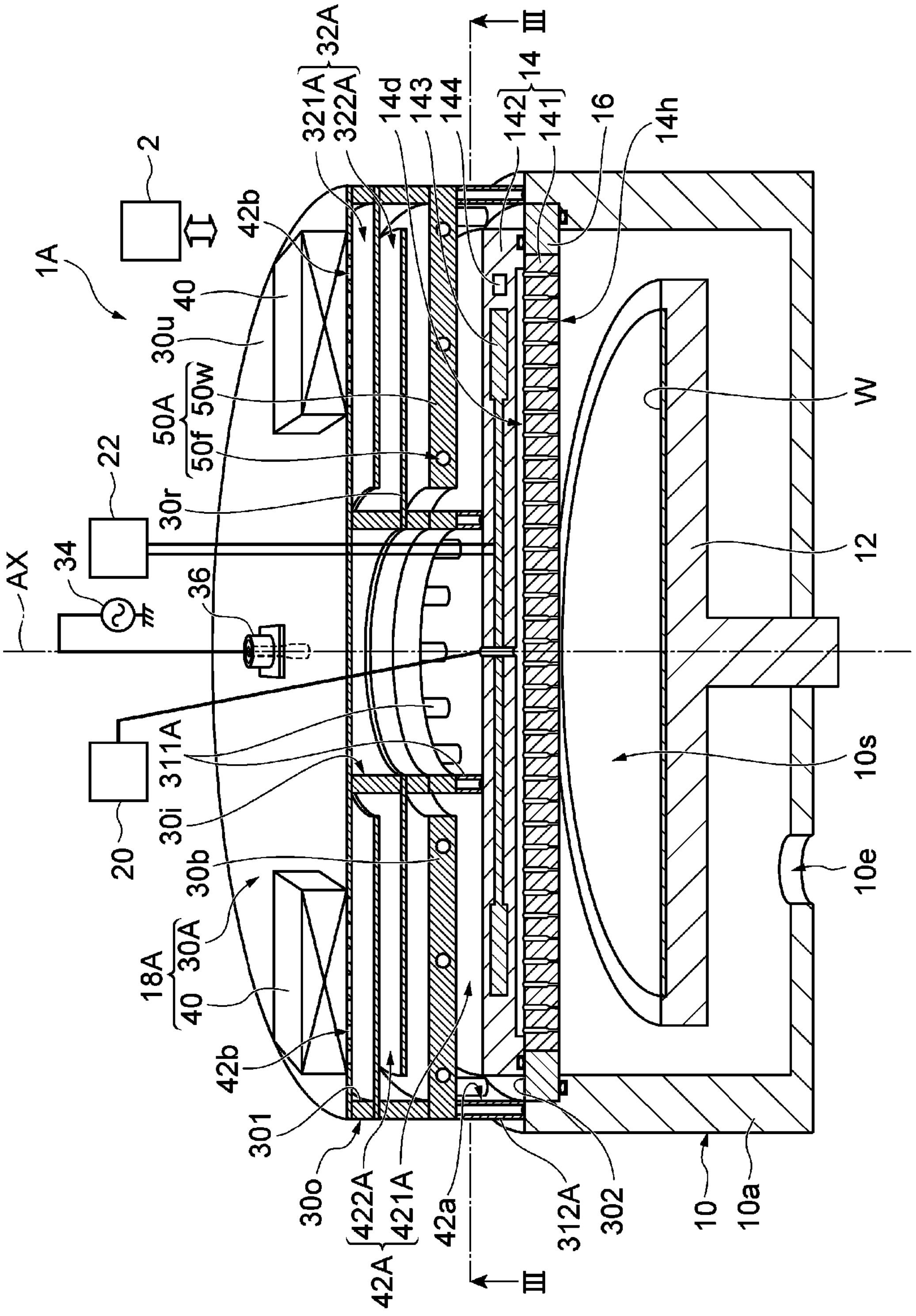
FIG. 2 is a view illustrating a plasma processing apparatus according to another exemplary embodiment.
Figure 3:
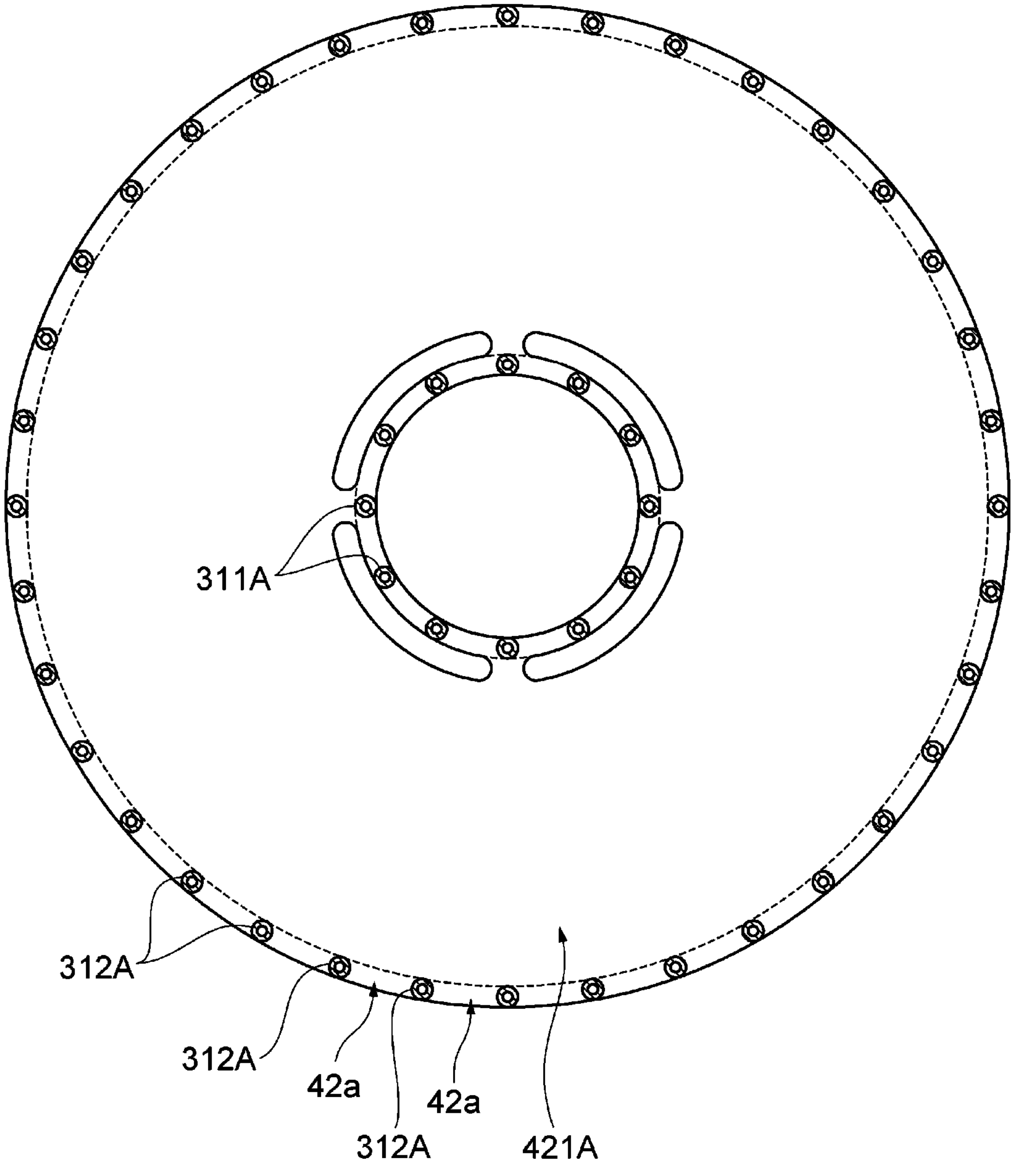
FIG. 3 is a cross-sectional view taken along line III-III in FIG. 2.

Hereinafter, a plasma processing apparatus according to another exemplary embodiment will be described with reference to FIGS. 2 and 3. FIG. 2 is a view illustrating a plasma processing apparatus according to another exemplary embodiment. FIG. 3 is a cross-sectional view taken along line III-III in FIG. 2. Hereinafter, a plasma processing apparatus 1A illustrated in FIGS. 2 and 3 will be described in terms of differences from the plasma processing apparatus 1.

The plasma processing apparatus 1A includes a resonator 30A instead of the resonator 30. The resonator 30A is provided above the excitation electrode 14. The resonator 30A provides a cavity 32A. The cavity 32A is formed by a wall made of a conductive material such as a metal. The resonator 30A includes the first end 301 and the second end 302. The first end 301 is provided above the second end 302. The first end 301 extends in the circumferential direction around the axis AX. The first end 301 is provided by the outer periphery 300 of the resonator 30A. The second end 302 is located externally to the excitation electrode 14 and is coupled to the emitter 16. The resonator 30A is configured to resonate electromagnetic waves propagating in the cavity 32A by reflecting the electromagnetic waves at the first end 301 and the second end 302. The electromagnetic waves resonated in the resonator 30A are supplied from the second end 302 to the emitter 16, thus being emitted into the plasma generation space.

The cavity 32A is configured to be axially or rotationally symmetrical with respect to the axis AX. The cavity 32A may include an upper portion 321A and a bent portion 322A. The upper portion 321A extends from the first end 301 to the inner periphery 30*i* of the resonator 30A in the direction toward the axis AX. The bent portion 322A includes the upper portion 321A. The bent portion 322A extends from the first end 301 to the second end 302.

The bent portion 322A and the cavity 32A are alternately bent in opposite directions to form a plurality of layers. In the plasma processing apparatus 1A, the opposite directions are the direction toward the axis AX and a direction away from the axis AX. That is, the bent portion 322A meanders to extend alternately in the direction toward the axis AX and in the direction away from the axis AX. The resonator 30A includes a plurality of plates 30*r* arranged alternately with the plurality of layers of the cavity 32A. The plates 30*r* form the layers of the cavity 32A. A planar shape of the plates 30*r* is annular or circular.

In the plasma processing apparatus 1A, the inner conductor of the connector 36 is connected to a wall defining the upper portion 321A from below, and an outer conductor of the connector 36 is connected to a wall (upper wall 30*u*) defining the upper portion 321A from above.

The plasma processing apparatus 1A includes a temperature regulator 18A instead of the temperature regulator 18. The temperature regulator 18A is configured to supply a heat medium along the upper surface of the excitation electrode 14, similar to the temperature regulator 18.

The temperature regulator 18A includes the plurality of fans 40, similar to the temperature regulator 18. The temperature regulator 18A provides a flow path 42A. The fans 40 are arranged above the excitation electrode 14 at substantially equal intervals around the axis AX. The fans 40 are configured to create a flow of the heat medium in the flow path 42A. In the plasma processing apparatus 1A, each of the fans 40 may suction and discharge the heat medium from the flow path 42A.

The flow path 42A extends from a plurality of openings 42*a* to a plurality of openings 42*b*. The openings 42*a* serve as an inlet for the heat medium to the flow path 42A. The openings 42*b* serve as an outlet for the heat medium from the flow path 42A. Each of the openings 42*b* is open directly below a corresponding fan among the plurality of fans 40.

The flow path 42A is axially or rotationally symmetrical with respect to the axis AX. The flow path 42A includes a partial flow path 421A (first partial flow path) and a partial flow path 422A (second partial flow path).

The partial flow path 421A extends along the upper surface of the excitation electrode 14. The partial flow path 421A extends from the openings 42*a* in the direction toward the axis AX.

The partial flow path 422A is connected to the partial flow path 421A and extends alternately in opposite directions between the plurality of fans 40 and the partial flow path 421A. The opposite directions are the direction toward the axis AX and the direction away from the axis AX. All the opposite directions are perpendicular to the axis AX. The partial flow path 422A is connected to an inner end of the partial flow path 421A.

In the plasma processing apparatus 1A, the heat medium introduced from the openings 42*a* flows along the upper surface of the excitation electrode 14 in the partial flow path 421A. As a result, heat exchange occurs between the excitation electrode 14 and the heat medium. Then, the heat medium flows from the partial flow path 421A to the partial flow path 422A and is discharged from the openings 42*b* to the outside of the plasma processing apparatus 1A by the fans 40.

The temperature regulator 18A may further include a cooler 50A. The cooler 50A may form a portion of the partial flow path 422A and the partial flow path 421A. Specifically, the cooler 50A includes the wall 50*w*, and provides the coolant flow path 50*f* in the wall 50*w*. A coolant is supplied from a chiller unit to the coolant flow path 50*f*. In the cooler 50A, the wall 50*w* is an annular plate. The wall 50*w* forms the partial flow path 421A between the wall 50*w* and the excitation electrode 14. Further, the wall 50*w* forms a portion of the partial flow path 422A between the wall 50*w* and a plate immediately above the wall 50*w*. With the temperature regulator 18A, the heat medium cooled by the cooler 50A in the partial flow paths 421A and 422A is discharged to the outside from the fans 40.

In one embodiment, the flow path 42A of the temperature regulator 18A, i.e., the partial flow paths 421A and 422A, may be formed with the cavity 32A of the resonator 30A. In this case, the resonator 30A constitutes a heat exchanger for the excitation electrode 14. In addition, in the plasma processing apparatus 1A, the partial flow path 421A is formed between the excitation electrode 14 and a lowermost plate 30*b* among the plurality of plates 30*r*. The plate 30*b* constitutes the wall 50*w* described above. In addition, any other plate 30*r* may constitute the cooler 50A.

In one embodiment, a vertical length (height) of a cavity in an uppermost layer among the plurality of layers in the cavity 32A may be longer than vertical lengths (heights) of cavities in any other layers among the plurality of layers. In this case, the uppermost layer is provided near the fans 40. Thus, a flow velocity of the heat medium in the uppermost layer is high. According to this embodiment, it is possible to prevent a pressure loss of the heat medium in the uppermost layer where the flow velocity is high.

In addition, the resonator 30A may further include an inner heat-insulator 311A and an outer heat-insulator 312A. The inner heat-insulator 311A and the outer heat-insulator 312A prevent heat transfer between the resonator 30A and the excitation electrode 14. The inner heat-insulator 311A and the outer heat-insulator 312A partially form the cavity 32A of the resonator 30A and also form the partial flow path 421A. The partial flow path 421A extends between the inner heat-insulator 311A and the outer heat-insulator 312A.

The inner heat-insulator 311A is provided inside the outer heat-insulator 312A. The inner heat-insulator 311A constitutes a portion of the inner periphery 30*i* of the resonator 30A and extends upward from the excitation electrode 14.

The outer heat-insulator 312A constitutes a portion of the outer periphery 300 of the resonator 30A and extends from a top of the sidewall 10*a* of the chamber 10 to the plate 30*b*.

Each of the inner heat-insulator 311A and the outer heat-insulator 312A is formed by a plurality of pillars arranged along the circumferential direction around the axis AX. Each of the pillars extends substantially parallel to the axis AX. Each pillar in each of the inner heat-insulator 311A and the outer heat-insulator 312A has a lower thermal conductivity than thermal conductivities of other walls defining the cavity 32A of the resonator 30A. Each pillar in each of the inner heat-insulator 311A and the outer heat-insulator 312A may be made of a metal having a low thermal conductivity such as stainless steel. Further, each pillar in each of the inner heat-insulator 311A and the outer heat-insulator 312A may include a coating made of silver, gold, copper, or rhodium to reduce a surface resistance thereof.

In each of the inner heat-insulator 311A and the outer heat-insulator 312A, the pillars are arranged such that the pillars and a plurality of gaps are arranged alternately along the circumferential direction. In the outer heat-insulator 312A, the plurality of gaps constitutes the plurality of openings 42*a*. Thus, in the plasma processing apparatus 1A, the heat medium is introduced into the partial flow path 421A from the outer periphery 300 of the resonator 30A. The heat medium flows through the partial flow paths 421A and 422A and is discharged to the outside of the plasma processing apparatus 1A by the fans 40.

Figure 4:
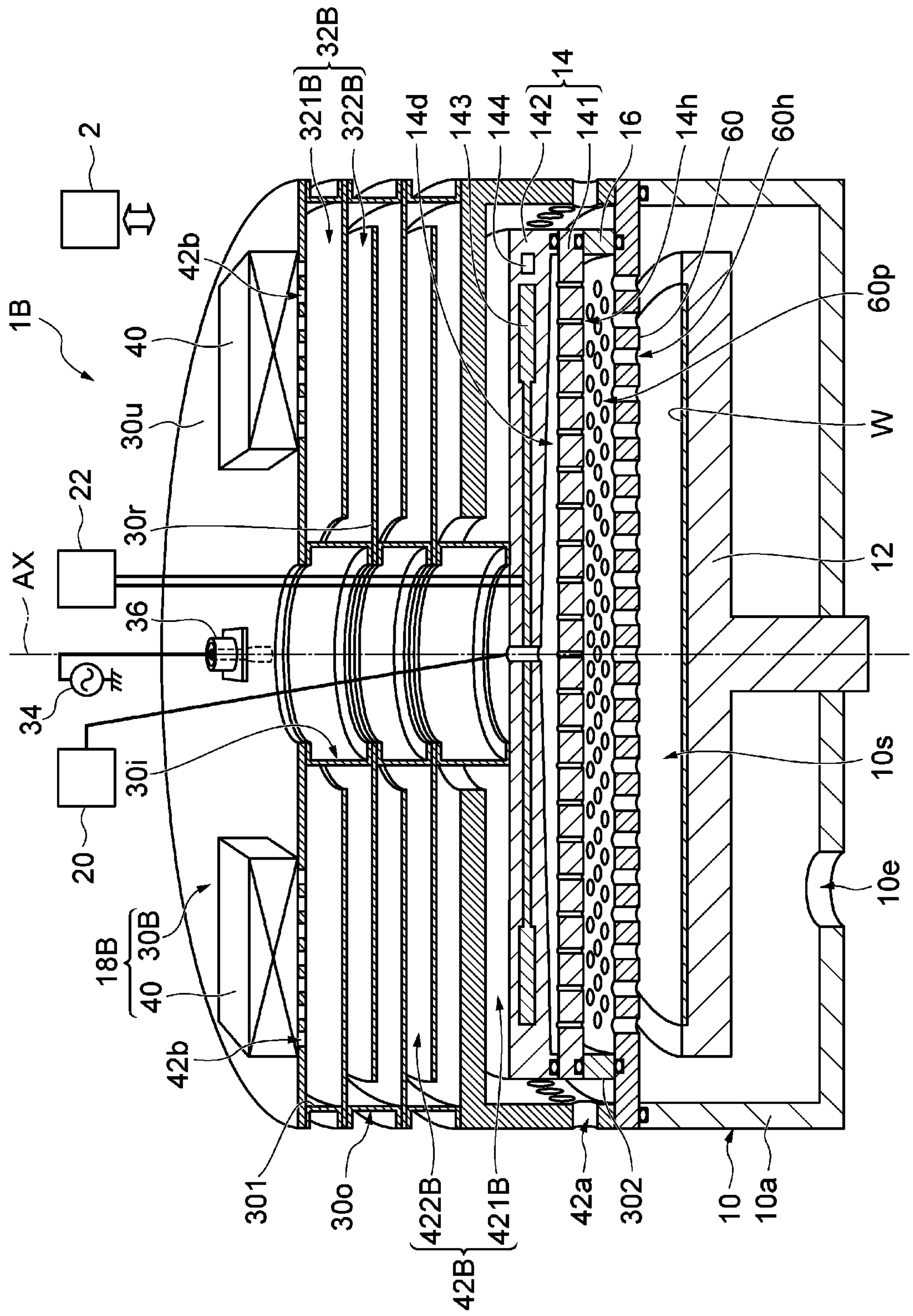
FIG. 4 is a view illustrating a plasma processing apparatus according to another exemplary embodiment.

Hereinafter, a plasma processing apparatus according to another exemplary embodiment will be described with reference to FIG. 4. FIG. 4 is a view illustrating a plasma processing apparatus according to another exemplary embodiment. Hereinafter, a plasma processing apparatus 1B illustrated in FIG. 4 will be described in terms of differences from the plasma processing apparatus 1A.

The plasma processing apparatus 1B may further include another excitation electrode 60. The excitation electrode 60 has a substantially disk shape and is disposed to close an upper end opening of the chamber 10. The excitation electrode 60 provides a plurality of holes 60*h*. The holes 60*h* penetrate the excitation electrode 60 in a thickness direction. The excitation electrode 14 is located above the excitation electrode 60. The excitation electrode 14 and the excitation electrode 60 form a plasma generation space 60*p* therebetween. The emitter 16 surrounds the plasma generation space 60*p* and is sandwiched between the excitation electrode 14 and the excitation electrode 60. In the plasma processing apparatus 1B, the plasma generation space 60*p* is spaced apart from the processing space 10*s* and is provided above the processing space 10*s*.

In the plasma processing apparatus 1B, a gas from the gas supply 20 is supplied to the plasma generation space 60*p* via the gas diffusion chamber 14*d* and the gas holes 14*h*. In the plasma generation space 60*p*, plasma is generated from the gas by electromagnetic waves introduced into the plasma generation space 60*p* from the emitter 16. Active species in the plasma generated in the plasma generation space 60*p* are supplied to the processing space 10*s* from the holes 60*h*.

In addition, the plasma processing apparatus 1B includes a resonator 30B instead of the resonator 30A. The resonator 30B is provided above the excitation electrode 14. The resonator 30B provides a cavity 32B. The cavity 32B is formed by a wall made of a conductive material such as a metal, similar to the cavity 32A. The resonator 30B includes the first end 301 and the second end 302. The first end 301 is provided above the second end 302. The first end 301 extends in the circumferential direction around the axis AX. The first end 301 is provided by the outer periphery 300 of the resonator 30B. The second end 302 is coupled to the emitter 16. The resonator 30B is configured to resonate electromagnetic waves propagating in the cavity 32B by reflecting the electromagnetic waves at the first end 301 and the second end 302. The electromagnetic waves resonated in the resonator 30B are supplied from the second end 302 to the emitter 16, thus being emitted into the plasma generation space 60*p*.

The cavity 32B is configured to be axially or rotationally symmetrical with respect to the axis AX, similar to the cavity 32A. The cavity 32B includes an upper portion 321B similar to the upper portion 321A and a bent portion 322B similar to the bent portion 322A. In the plasma processing apparatus 1B, the inner conductor of the connector 36 is connected to a wall defining the upper portion 321B from below, and the outer conductor of the connector 36 is connected to a wall (upper wall 30*u*) defining the upper portion 321B from above.

The plasma processing apparatus 1B includes a temperature regulator 18B instead of the temperature regulator 18A. The temperature regulator 18B is configured to supply a heat medium along the upper surface of the excitation electrode 14, similar to the temperature regulator 18A. The temperature regulator 18B may not include a structure for cooling the heat medium, such as the cooler 50A.

The temperature regulator 18B includes the plurality of fans 40, similar to the temperature regulator 18A. The temperature regulator 18B provides a flow path 42B. The fans 40 are arranged above the excitation electrode 14 at substantially equal intervals around the axis AX. The fans 40 are configured to create a flow of the heat medium in the flow path 42B. In the plasma processing apparatus 1B, each of the fans 40 supplies the heat medium to the flow path 42B from the outside of the plasma processing apparatus 1B. That is, in the plasma processing apparatus 1B, each of the fans 40 is a blowing fan.

The flow path 42B is axially or rotationally symmetrical with respect to the axis AX, similar to the flow path 42A. The flow path 42B includes a partial flow path 421B (first partial flow path) similar to the partial flow path 421A and a partial flow path 422B (second partial flow path) similar to the partial flow path 422A.

In one embodiment, the flow path 42B, i.e., the partial flow paths 421B and 422B, may be formed with the cavity 32B of the resonator 30B. In this case, the resonator 30B constitutes a heat exchanger for the excitation electrode 14.

The flow path 42B extends from the plurality of openings 42*b* to the plurality of openings 42*a*. The openings 42*b* serve as an inlet for the heat medium to the flow path 42B and are connected to the partial flow path 422B. Each of the openings 42*b* is open directly below a corresponding fan among the plurality of fans 40. The openings 42*a* serve as an outlet for the heat medium from the flow path 42B and are connected to the partial flow path 421B. The openings 42*a* are arranged along the circumferential direction around the axis AX. In one embodiment, the openings 42*a* are formed in the outer periphery 300 of the resonator 30B.

In one embodiment, a vertical length (height) of a cavity in an uppermost layer among the plurality of layers in the cavity 32B may be longer than vertical lengths (heights) of cavities in any other layers among the plurality of layers, similar to the cavity 32A.

In the plasma processing apparatus 1B, the heat medium is supplied from the fans 40 to the partial flow path 421B via the openings 42*b* and the partial flow path 422B and flows along the upper surface of the excitation electrode 14 in the partial flow path 421B. As a result, heat exchange occurs between the excitation electrode 14 and the heat medium. Then, the heat medium is discharged from the partial flow path 421B to the outside of the plasma processing apparatus 1B via the openings 42*a*.

Figure 5:
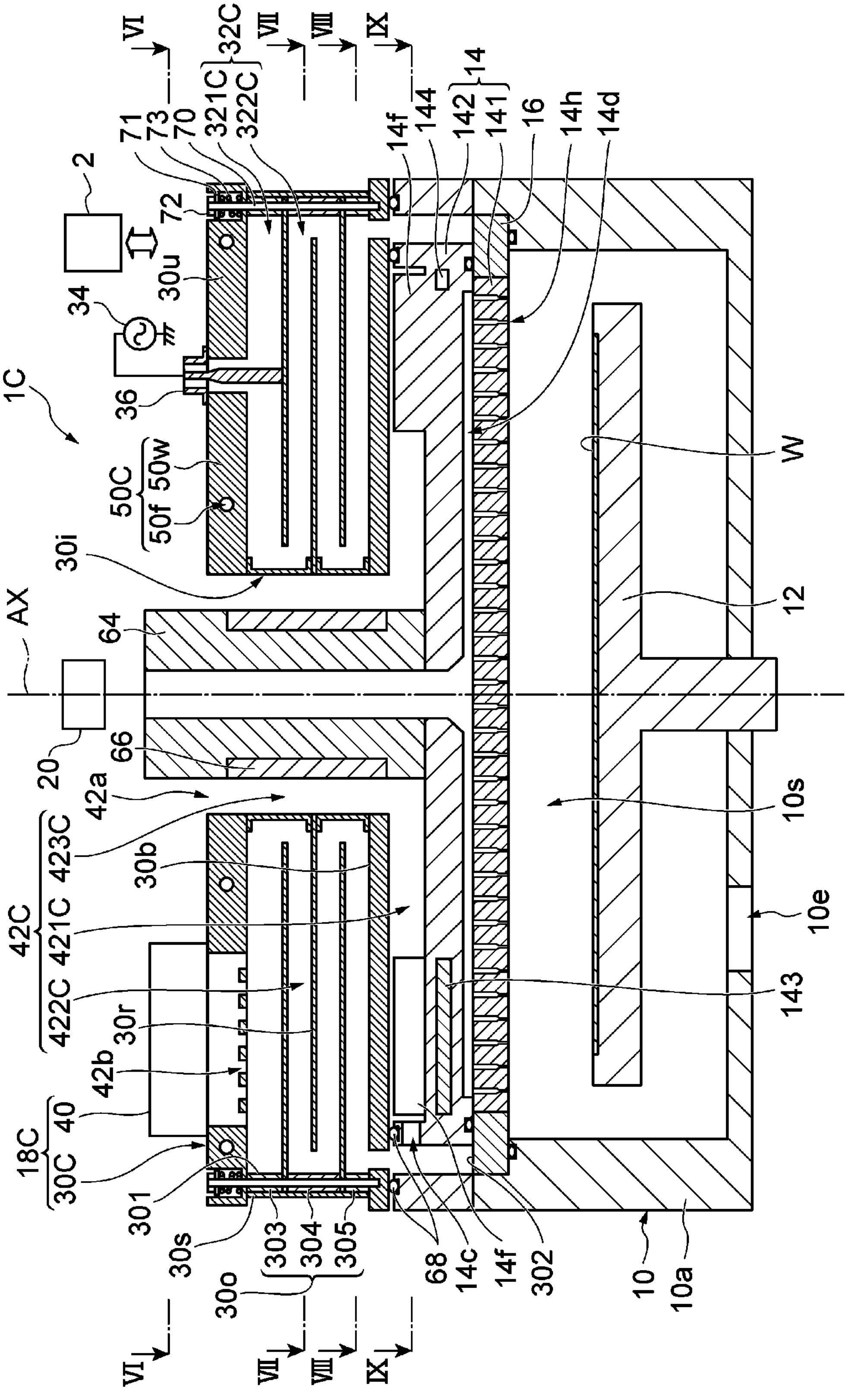
FIG. 5 is a view illustrating a plasma processing apparatus according to another exemplary embodiment.
Figure 6:
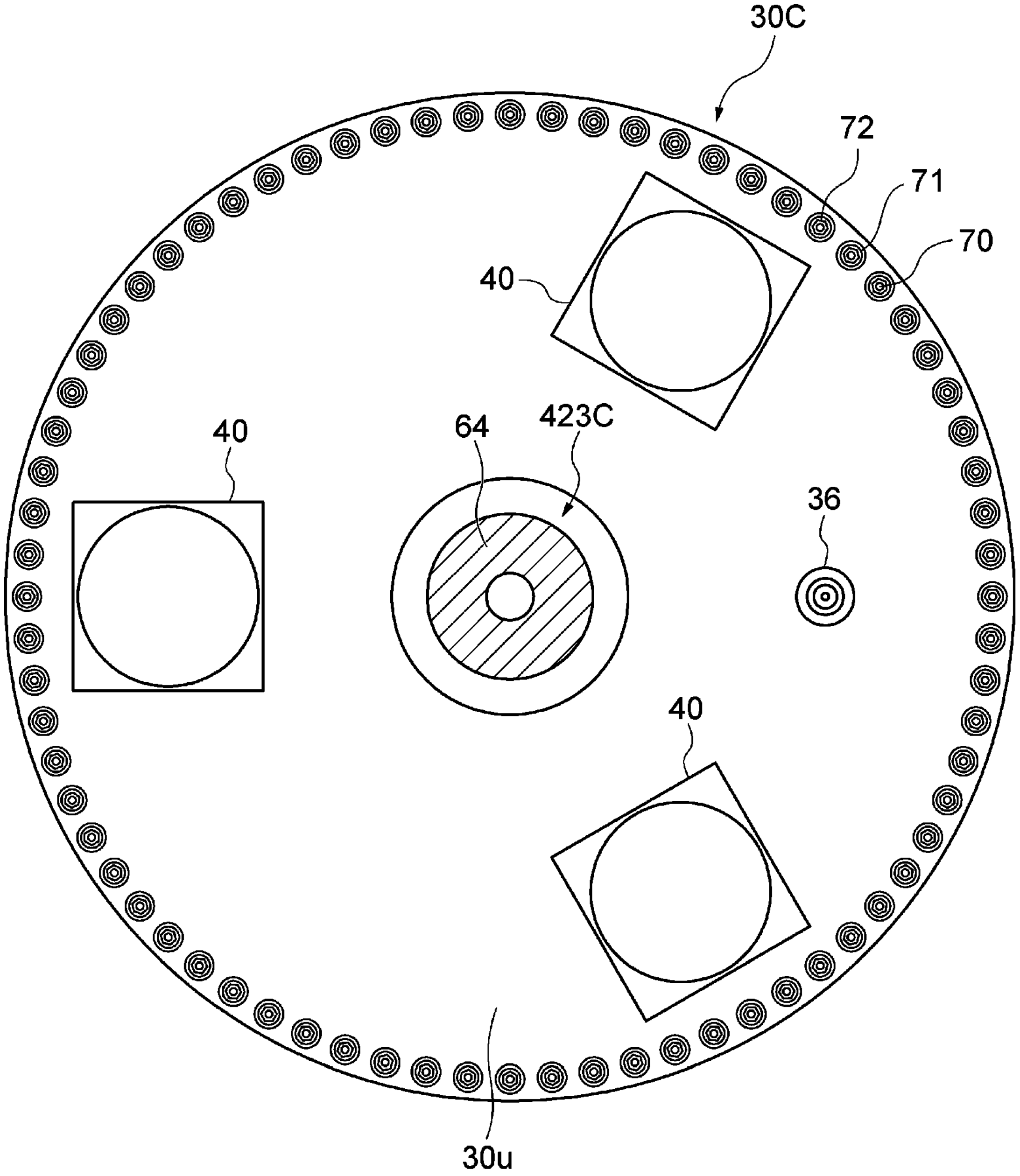
FIG. 6 is a cross-sectional view taken along line VI-VI in FIG. 5.
Figure 7:
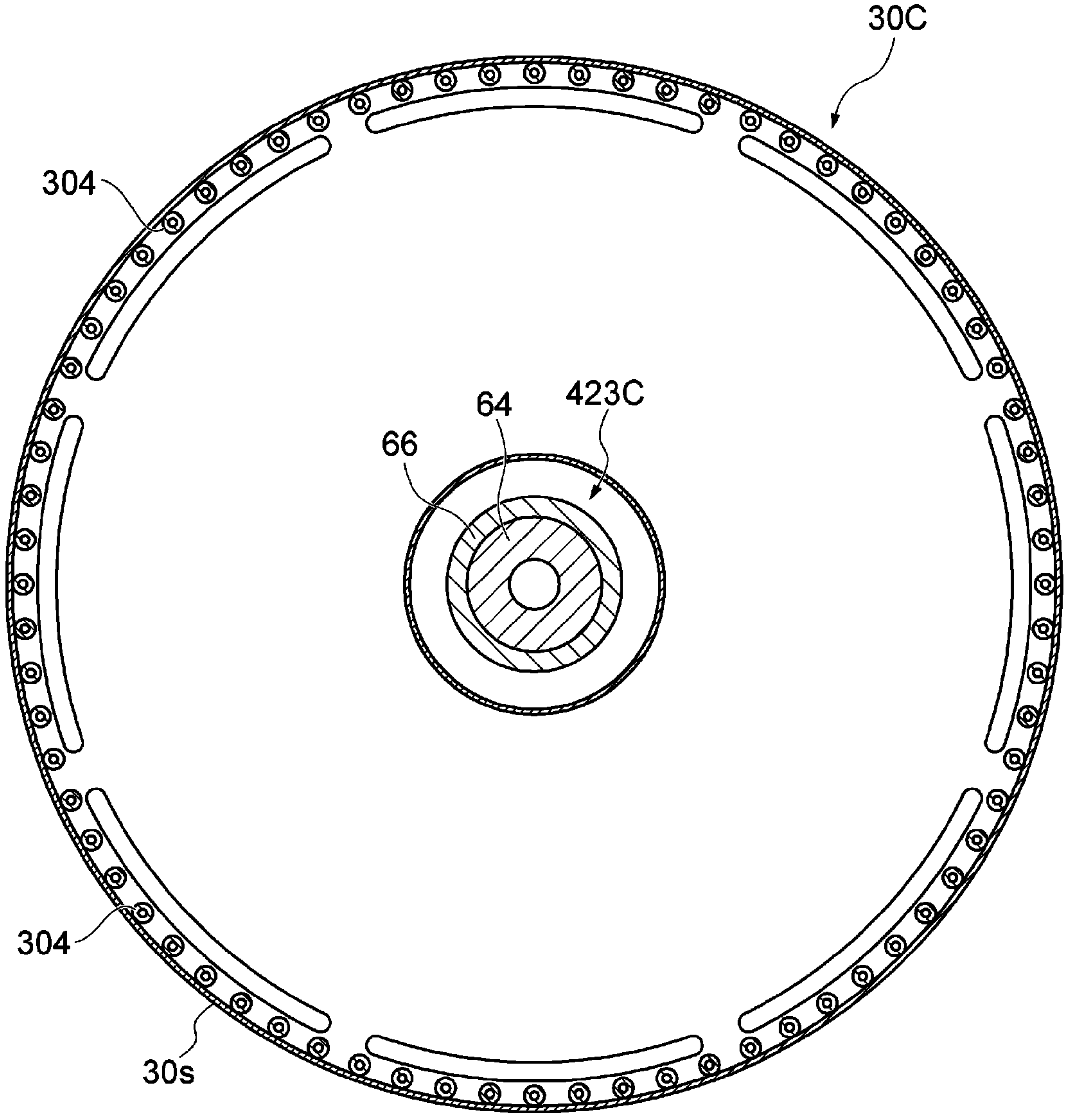
FIG. 7 is a cross-sectional view taken along line VII-VII in FIG. 5.
Figure 8:
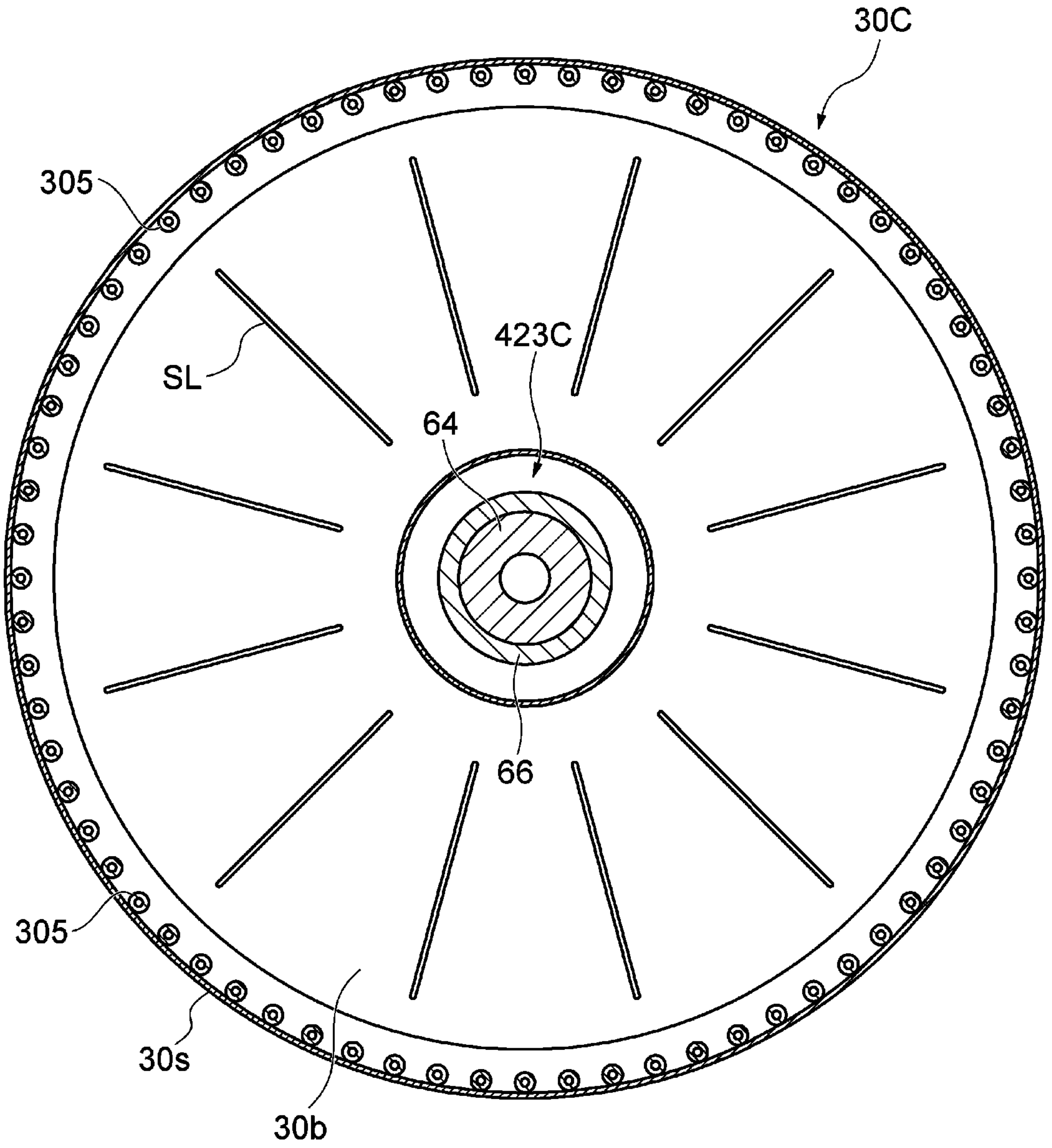
FIG. 8 is a cross-sectional view taken along line VIII-VIII in FIG. 5.
Figure 9:
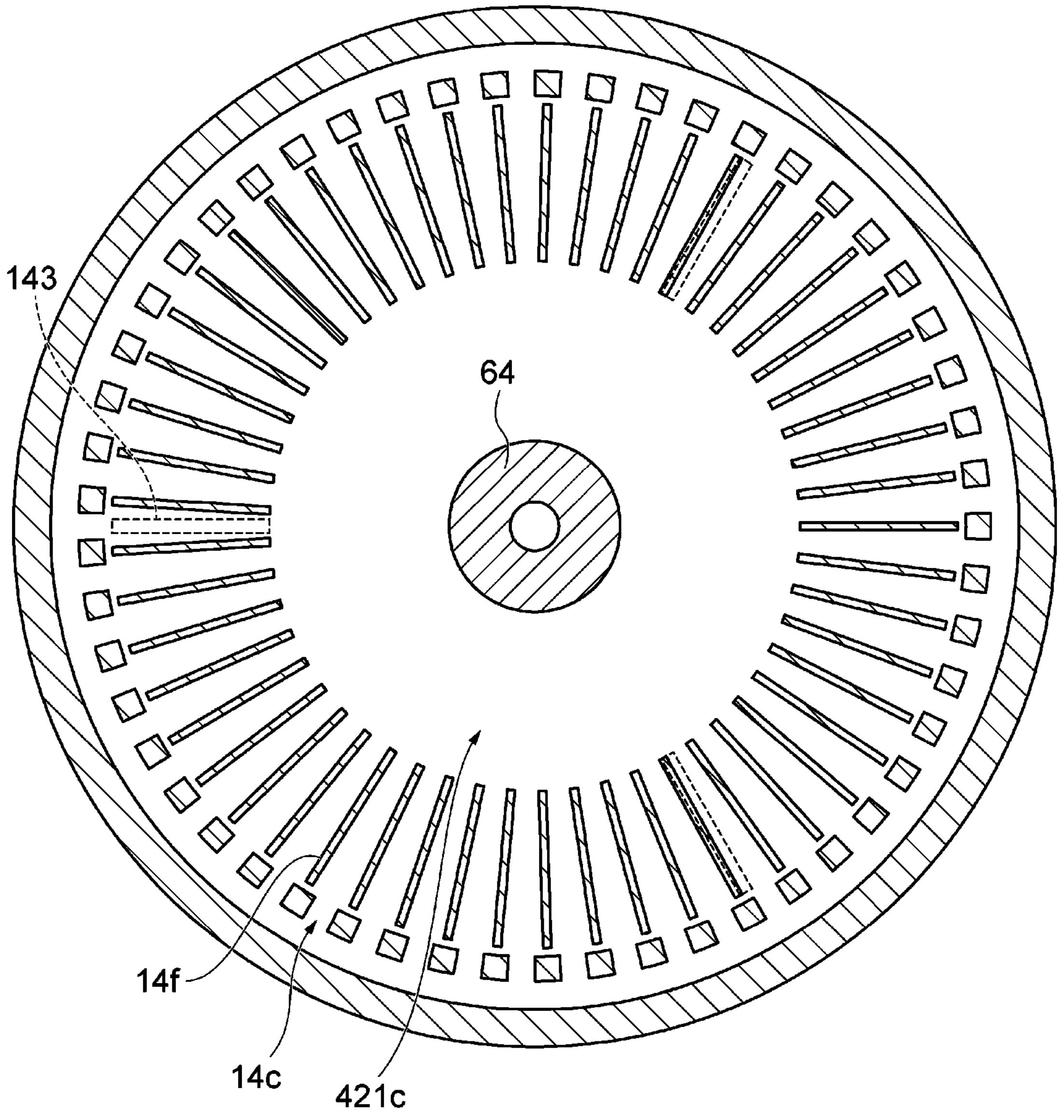
FIG. 9 is a cross-sectional view taken along line IX-IX in FIG. 5.

Hereinafter, a plasma processing apparatus according to another exemplary embodiment will be described with reference to FIGS. 5 to 9. FIG. 5 is a view illustrating a plasma processing apparatus according to another exemplary embodiment. FIG. 6 is a cross-sectional view taken along line VI-VI in FIG. 5. FIG. 7 is a cross-sectional view taken along line VII-VII in FIG. 5. FIG. 8 is a cross-sectional view taken along line VIII-VIII in FIG. 5. FIG. 9 is a cross-sectional view taken along line IX-IX in FIG. 5. Hereinafter, a plasma processing apparatus 1C illustrated in FIGS. 5 to 9 will be described in terms of differences from the plasma processing apparatus 1A.

The plasma processing apparatus 1C includes a resonator 30C instead of the resonator 30A. The resonator 30C is provided above the excitation electrode 14. The resonator 30C provides a cavity 32C. The cavity 32C is formed by a wall made of a conductive material such as a metal. The resonator 30C includes the first end 301 and the second end 302. The first end 301 is located above the second end 302. The first end 301 extends in the circumferential direction around the axis AX. The first end 301 is provided by the outer periphery 300 of the resonator 30C. The second end 302 is located externally to the excitation electrode 14 and is coupled to the emitter 16. The resonator 30C is configured to resonate electromagnetic waves propagating in the cavity 32C by reflecting the electromagnetic waves at the first end 301 and the second end 302. The electromagnetic waves resonated in the resonator 30C are supplied from the second end 302 to the emitter 16, thus being emitted into the plasma generation space.

The cavity 32C is configured to be axially or rotationally symmetrical with respect to the axis AX. The cavity 32C includes an upper portion 321C similar to the upper portion 321A and a bent portion 322C similar to the bent portion 322A. The upper portion 321C extends from the first end 301 to the inner periphery 30*i* of the resonator 30C in the direction toward the axis AX. The bent portion 322C includes the upper portion 321C. The bent portion 322C and the cavity 32C are alternately bent in opposite directions to form a plurality of layers. In the plasma processing apparatus 1C, the opposite directions are the direction toward the axis AX and the direction away from the axis AX. That is, the bent portion 322C meanders to extend alternately in the direction toward the axis AX and in the direction away from the axis AX. The opposite directions are perpendicular to the axis AX. The cavity 32C also has the plurality of layers, and the layers are alternately arranged with the plates 30*r*. A planar shape of the plates 30*r* is annular.

In the plasma processing apparatus 1C, the inner conductor of the connector 36 is connected to a wall defining the upper portion 321C from below, and the outer conductor of the connector 36 is connected to a wall (upper wall 30*u*) defining the upper portion 321C from above.

In one embodiment, the plasma processing apparatus 1C may further include at least one conductor 68. The conductor 68 is provided between the resonator 30C and the excitation electrode 14 to form a gap between the resonator 30C and the excitation electrode 14. The conductor 68 is made of a metal such as stainless steel. The conductor 68 may have elasticity. The conductor 68 is, for example, a shield spiral made of a metal. With the conductor 68, heat transfer between the resonator 30C and the excitation electrode 14 is suppressed.

The conductor 68 is sandwiched between the excitation electrode 14 and a lowermost plate 30*b* among the plurality of plates 30*r* of the resonator 30C. Thus, the conductor 68 electrically connects the resonator 30C to the excitation electrode 14. The conductor 68 may be disposed to form a ring around the axis AX. In the illustrated example, as the at least one conductor 68, two conductors 68 are disposed in a ring shape around the axis AX. The conductors 68 may be disposed along a location where a radio frequency current flows in the resonator 30C. In the illustrated example, the two conductors 68 are disposed along a pair of edges of a slot formed in the plate 30*b*.

In one embodiment, in order to further prevent heat transfer between the resonator 30C and the excitation electrode 14, the plate 30*b* may be partially made of an insulating material. The insulating material may be, for example, polyetheretherketone (PEEK).

In one embodiment, a plurality of slits SL may be formed in at least one plate 30*r* among the plurality of plates 30*r*. The slits SL penetrate the at least one plate 30*r* in a thickness direction. The slits SL are arranged along the circumferential direction around the axis AX and extend in the radial direction with respect to the axis AX. With the slits SL, propagation of harmonics of the electromagnetic waves in the circumferential direction is suppressed. Further, a pressure loss of the heat medium in the cavity 32C is suppressed. In addition, in the illustrated example, the slits SL are formed in the lowermost plate 30*b*.

In one embodiment, the outer periphery 300 of the resonator 30C may include a plurality of stages arranged along the vertical direction. One of the plurality of stages of the outer periphery 300, other than an uppermost stage 303 and a lowermost stage 305, may be made of an insulating material. The insulating material may be, for example, polyetheretherketone (PEEK). With the outer periphery 300 described above, heat transfer between the resonator 30C and the excitation electrode 14 is further suppressed.

One stage of the outer periphery 300 made of an insulating material is positioned at a location where an antinode of standing waves of the electromagnetic waves in the resonator 30C is formed. In this case, even when a portion of the wall defining the cavity 32C in the resonator 30C is made of an insulating material, a radio frequency current in that portion is small. Thus, even when a portion of the wall defining the cavity 32C in the resonator 30C is made of an insulating material, the electrical impact is small. In addition, in the illustrated example, the outer periphery 300 includes the uppermost stage 303, a middle stage 304, and the lowermost stage 305, and the middle stage 304 is made of an insulating material.

In one embodiment, one stage (e.g., the middle stage 304) of the outer periphery 300 made of an insulating material may be formed by a plurality of pillars arranged along the circumferential direction around the axis AX. Further, each of the other stages (e.g., the uppermost stage 303 and the lowermost stage 305), other than the one stage, among the plurality of stages of the outer periphery 300 may be formed by a plurality of pillars made of a metal (e.g., aluminum alloy) arranged along the circumferential direction around the axis AX. The pillars in each of the stages of the outer periphery 300 are aligned along the vertical direction with corresponding pillars in the other stages. The pillars in each of the stages of the outer periphery 300 may have a cylindrical shape. In this case, bolts 70 may pass through inner bores of the pillars aligned along the vertical direction. Lower ends of the bolts 70 may be screwed to the plate 30*b*. Further, a washer 71 and a nut 72 may be fastened to an upper end of each bolt 70, and a coil spring 73 may be provided between the washer 71 and the upper wall 30*u*.

In one embodiment, the plasma processing apparatus 1C may further include a shield thin plate 30*s*. The shield thin plate 30*s* is made of a metal such as stainless steel. The shield thin plate 30*s* has a cylindrical shape and surrounds the outer periphery 300 of the resonator 30C. With the shield thin plate 30*s*, leakage of the electromagnetic waves from the resonator 30C is suppressed.

The plasma processing apparatus 1C includes a temperature regulator 18C instead of the temperature regulator 18A. The temperature regulator 18C is configured to supply a heat medium along the upper surface of the excitation electrode 14, similar to the temperature regulator 18A.

The temperature regulator 18C includes the plurality of fans 40, similar to the temperature regulator 18A. The temperature regulator 18C provides a flow path 42C. The fans 40 are arranged above the excitation electrode 14 at substantially equal intervals around the axis AX. The fans 40 are configured to create a flow of the heat medium in the flow path 42C. In the plasma processing apparatus 1C, each of the fans 40 may suction and discharge the heat medium from the flow path 42C.

The flow path 42C extends from the opening 42*a* to the plurality of openings 42*b*. The opening 42*a* serves as an inlet for the heat medium to the flow path 42C. The openings 42*b* serve as an outlet for the heat medium from the flow path 42C. Each of the openings 42*b* is open directly below a corresponding fan among the plurality of fans 40.

The flow path 42C is axially or rotationally symmetrical with respect to the axis AX. The flow path 42C includes a partial flow path 421C (first partial flow path) similar to the partial flow path 421A and a partial flow path 422C (second partial flow path) similar to the partial flow path 422A. The flow path 42C may further include a partial flow path 423C (third partial flow path).

The partial flow path 421C extends along the upper surface of the excitation electrode 14. The partial flow path 421C is provided between the plate 30*b* of the resonator 30C and the excitation electrode 14. The partial flow path 421C extends in the radial direction from the axis AX. The partial flow path 422C is connected to the partial flow path 421C via a plurality of communication holes 14*c* formed in the upper electrode 142. The partial flow path 422C extends alternately in opposite directions between the plurality of fans 40 and the partial flow path 421C. The opposite directions are the direction toward the axis AX and the direction away from the axis AX. The opposite directions are perpendicular to the axis AX.

The partial flow path 423C extends from the opening 42*a* to the partial flow path 421C. The partial flow path 423C is provided inward of the inner periphery 30*i* of the resonator 30C. The partial flow path 423C may have the axis AX as a central axis thereof. That is, the partial flow path 423C may extend in the vertical direction to the partial flow path 421C along the axis AX.

In the plasma processing apparatus 1C, the heat medium introduced from the opening 42*a* is supplied from the partial flow path 423C to the partial flow path 421C and flows along the upper surface of the excitation electrode 14 in the partial flow path 421C. As a result, heat exchange occurs between the excitation electrode 14 and the heat medium. Then, the heat medium flows from the partial flow path 421C to the partial flow path 422C and is discharged from the openings 42*b* to the outside of the plasma processing apparatus 1 by the fans 40.

In one embodiment, a heater 66 may be provided inward of the inner periphery 30*i* of the resonator 30C. In this embodiment, a heat medium preheated by the heater 66 is supplied to the partial flow path 421C. For example, the heater 66 may preheat the heat medium to a temperature similar to the temperature of the excitation electrode 14 (e.g., 180 degrees C.). This improves temperature controllability of the excitation electrode 14.

In one embodiment, the plasma processing apparatus 1C may further include a gas pipe 64. The gas pipe 64 extends in the vertical direction at a location inward of the inner periphery 30*i*. A central axis of the gas pipe 64 may be located on the axis AX. The gas pipe 64 is connected between the gas diffusion chamber 14*d* and the gas supply 20. The heater 66 described above may surround the gas pipe 64. Further, the heater 66 may be installed on an outer periphery of the gas pipe 64.

The temperature regulator 18C may further include a cooler 50C. The cooler 50C may form a portion of the partial flow path 422C. Specifically, the cooler 50C includes the wall 50*w*, and provides the coolant flow path 50*f* in the wall 50*w*. A coolant is supplied from a chiller unit to the coolant flow path 50*f*. In the cooler 50C, the wall 50*w* is an annular plate. With the temperature regulator 18C, the heat medium cooled by the cooler 50C in the partial flow path 422C is discharged to the outside from the fans 40.

In one embodiment, the partial flow path 422C of the temperature regulator 18C may be formed with the cavity 32C of the resonator 30C. In this case, the resonator 30C constitutes a heat exchanger for the excitation electrode 14. In addition, in the plasma processing apparatus 1C, the wall 50*w* described above is the upper wall 30*u*. In addition, the wall 50*w* may be any of the plurality of plates 30*r* of the resonator 30C, rather than the upper wall 30*u*.

In one embodiment, a vertical length (height) of a cavity in an uppermost layer among the plurality of layers in the cavity 32C may be longer than vertical lengths (heights) of cavities in any other layers among the plurality of layers, similar to the cavity 32A.

In addition, in one embodiment, the excitation electrode 14 may have a plurality of fins 40*f*. The fins 40*f* are provided by the upper electrode 142. The fins 40*f* protrude upward, extend in the radial direction with respect to the axis AX, and are arranged along the circumferential direction around the axis AX. Each of the communication holes 14*c* described above is connected to a gap between two adjacent fins among the plurality of fins 40*f*. With the fins 40*f*, heat exchange between the excitation electrode 14 and the heat medium is promoted.

Figure 10:
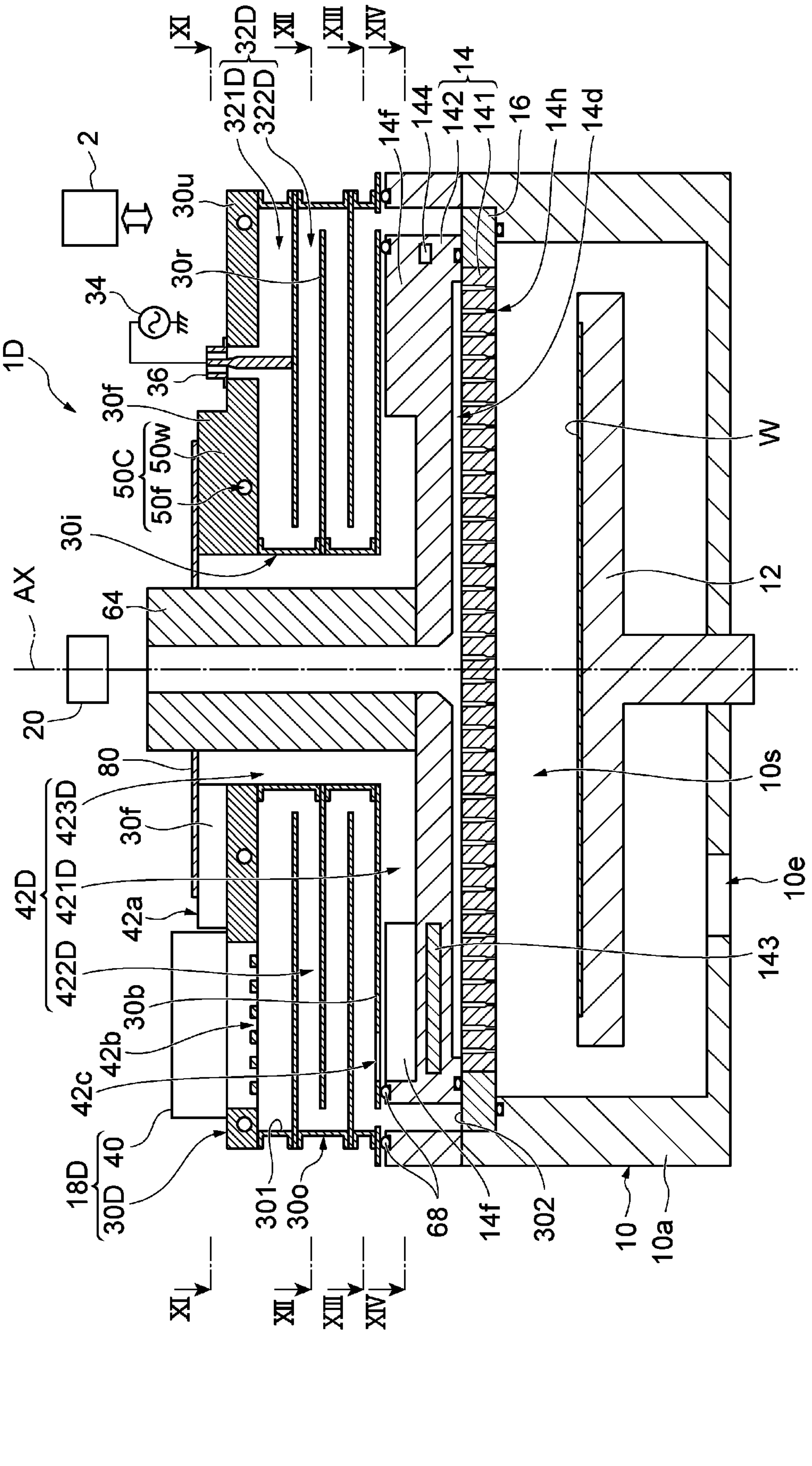
FIG. 10 is a view illustrating a plasma processing apparatus according to another exemplary embodiment.
Figure 11:
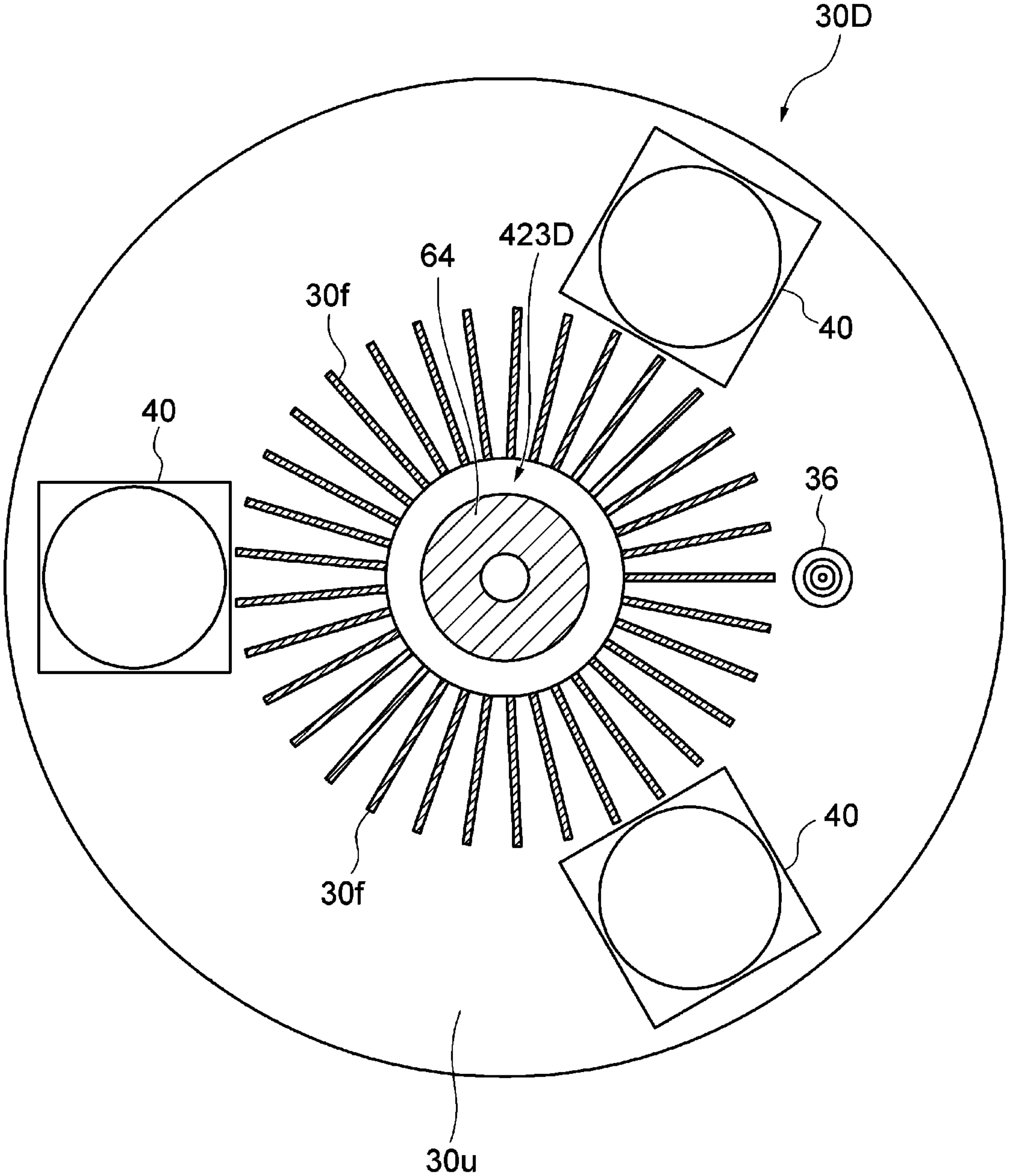
FIG. 11 is a cross-sectional view taken along line XI-XI in FIG. 10.
Figure 12:
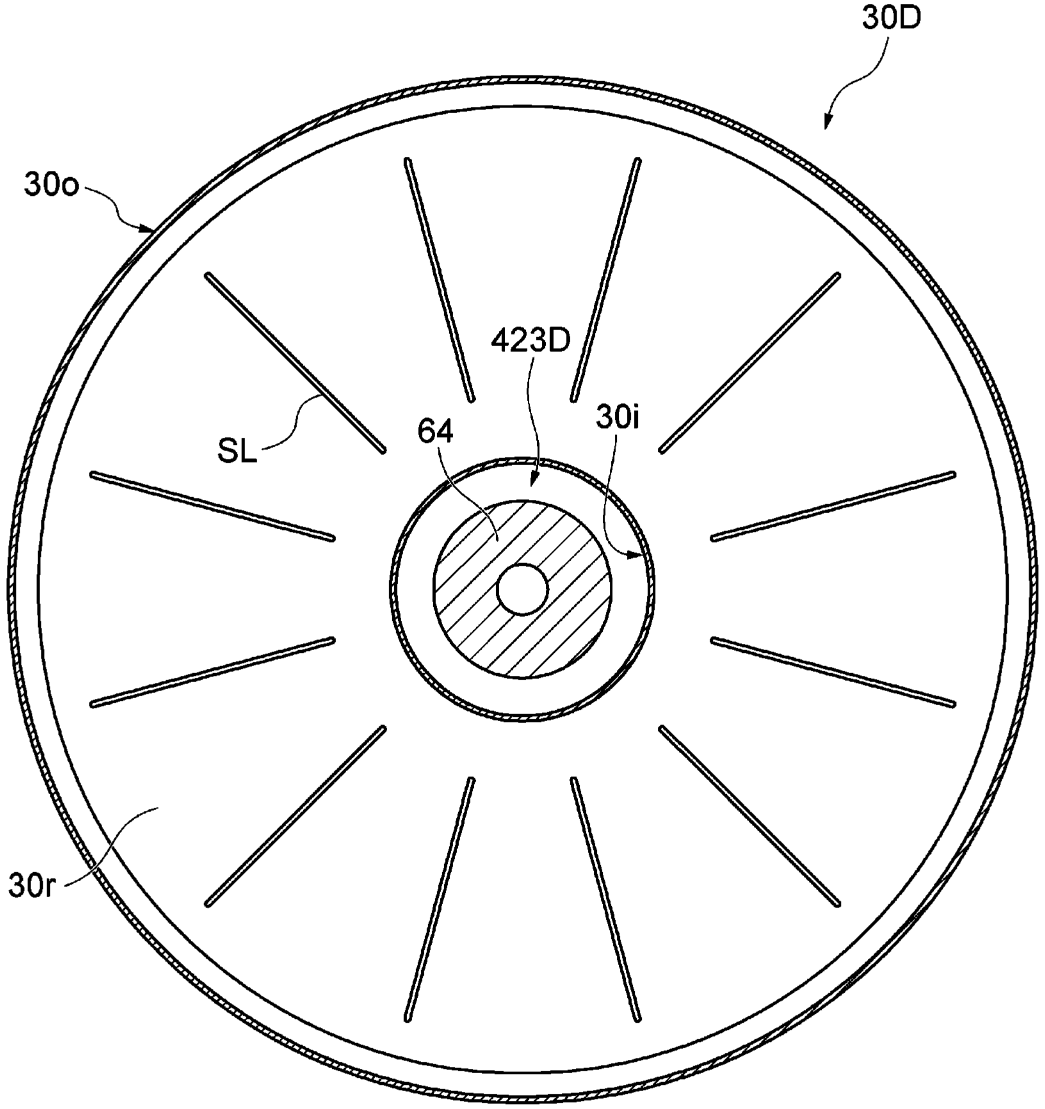
FIG. 12 is a cross-sectional view taken along line XII-XII in FIG. 10.
Figure 13:
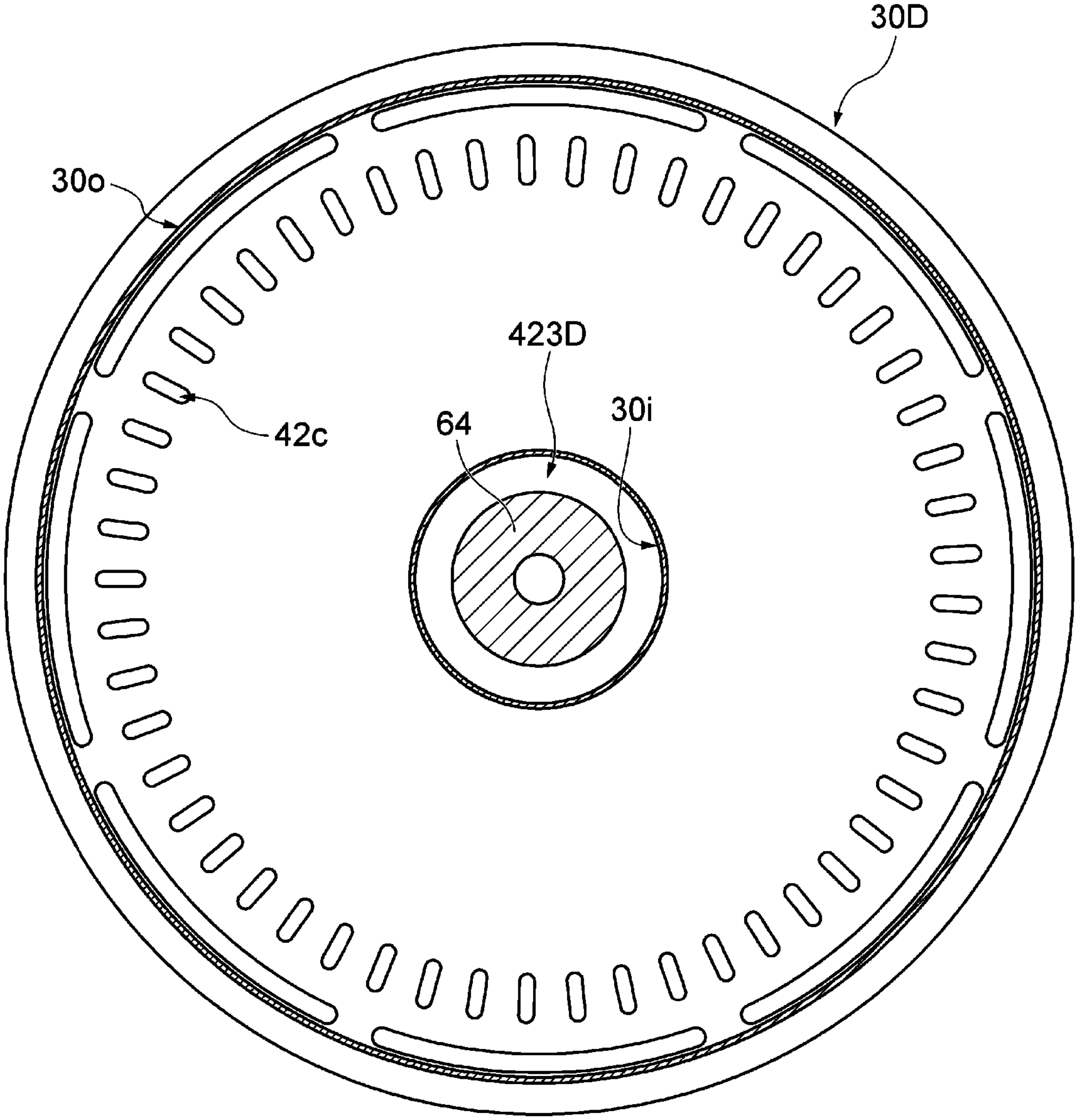
FIG. 13 is a cross-sectional view taken along line XIII-XIII in FIG. 10.
Figure 14:
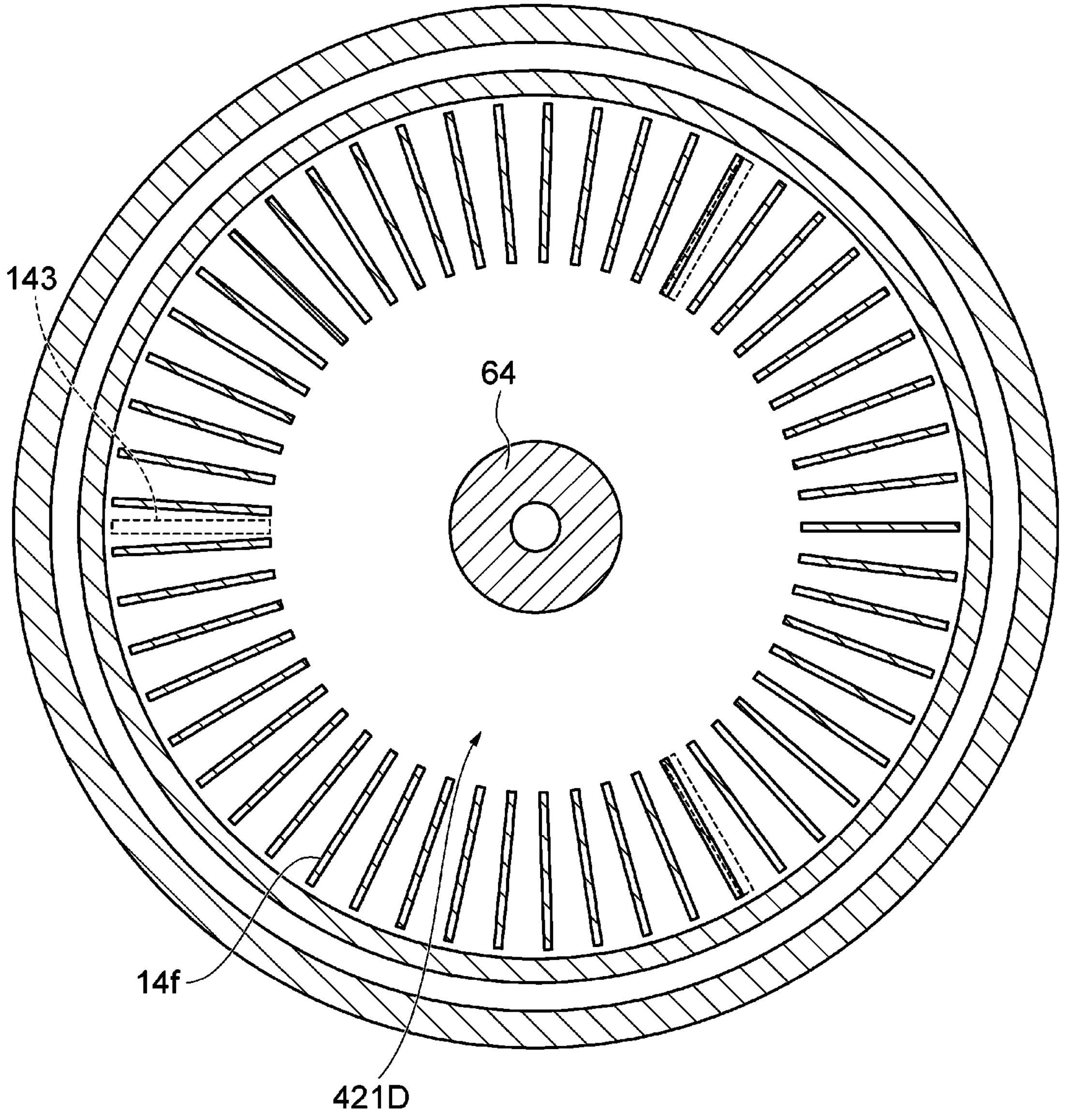
FIG. 14 is a cross-sectional view taken along line XIV-XIV in FIG. 10.

Hereinafter, a plasma processing apparatus according to another exemplary embodiment will be described with reference to FIGS. 10 to 14. FIG. 10 is a view illustrating a plasma processing apparatus according to another exemplary embodiment. FIG. 11 is a cross-sectional view taken along line XI-XI in FIG. 10. FIG. 12 is a cross-sectional view taken along line XII-XII in FIG. 10. FIG. 13 is a cross-sectional view taken along line XIII-XIII in FIG. 10. FIG. 14 is a cross-sectional view taken along line XIV-XIV in FIG. 10. Hereinafter, a plasma processing apparatus 1D illustrated in FIGS. 10 to 14 will be described in terms of differences from the plasma processing apparatus 1C.

The plasma processing apparatus 1D includes a resonator 30D instead of the resonator 30C. The resonator 30D is provided above the excitation electrode 14. The resonator 30D provides a cavity 32D. The cavity 32D is formed by a wall made of a conductive material such as a metal. The resonator 30D includes the first end 301 and the second end 302. The first end 301 is located above the second end 302. The first end 301 extends in the circumferential direction around the axis AX. The first end 301 is provided by the outer periphery 300 of the resonator 30D. The second end 302 is located externally to the excitation electrode 14 and is coupled to the emitter 16. The resonator 30D is configured to resonate electromagnetic waves propagating in the cavity 32D by reflecting the electromagnetic waves at the first end 301 and the second end 302. The electromagnetic waves resonated in the resonator 30D are supplied from the second end 302 to the emitter 16, thus being emitted into the plasma generation space.

The cavity 32D is configured to be axially or rotationally symmetrical with respect to the axis AX. The cavity 32D includes an upper portion 321D similar to the upper portion 321C and a bent portion 322D similar to the bent portion 322C. The upper portion 321D extends from the first end 301 to the inner periphery 30*i* of the resonator 30D in the direction toward the axis AX. The bent portion 322D includes the upper portion 321D. The bent portion 322D and the cavity 32D are alternately bent in opposite directions to form a plurality of layers. In the plasma processing apparatus 1D, the opposite directions are the direction toward the axis AX and the direction away from the axis AX. That is, the bent portion 322D meanders to extend alternately in the direction toward the axis AX and in the direction away from the axis AX. The opposite directions are perpendicular to the axis AX. The cavity 32D also has the plurality of layers, and the layers are alternately arranged with the plates 30*r*. A planar shape of the plates 30*r* is annular.

In one embodiment, the plurality of slits SL may be formed in at least one plate 30*r* among the plurality of plates 30*r*. The slits SL penetrate the at least one plate 30*r* in the thickness direction. The plurality of slits SL are arranged along the circumferential direction around the axis AX and extend in the radial direction from the axis AX. With the slits SL, propagation of harmonics of the electromagnetic waves in the circumferential direction is suppressed. Further, a pressure loss of the heat medium in the cavity 32D is suppressed.

The plasma processing apparatus 1D includes a temperature regulator 18D instead of the temperature regulator 18C. The temperature regulator 18D is configured to supply a heat medium along the upper surface of the excitation electrode 14, similar to the temperature regulator 18C.

The temperature regulator 18D includes the plurality of fans 40, similar to the temperature regulator 18C. The temperature regulator 18D provides a flow path 42D. The fans 40 are arranged above the excitation electrode 14 at substantially equal intervals around the axis AX. The fans 40 are configured to create a flow of the heat medium in the flow path 42D. In the plasma processing apparatus 1D, each of the fans 40 supplies the heat medium to the flow path 42D from the outside of the plasma processing apparatus 1D. That is, in the plasma processing apparatus 1D, each of the fans 40 is a blowing fan.

The flow path 42D is axially or rotationally symmetrical with respect to the axis AX, similar to the flow path 42C. The flow path 42D includes a partial flow path 421D (first partial flow path) similar to the partial flow path 421C and a partial flow path 422D (second partial flow path) similar to the partial flow path 422C. The flow path 42D may further include a partial flow path 423D (third partial flow path).

The flow path 42D extends from the plurality of openings 42*b* to the opening 42*a*. The openings 42*b* serve as an inlet for the heat medium to the flow path 42D and are connected to the partial flow path 422D. Each of the openings 42*b* is open directly below a corresponding fan among the plurality of fans 40. The opening 42*a* serves as an outlet for the heat medium from the flow path 42D and is connected to the partial flow path 423D.

The partial flow path 421D extends along the upper surface of the excitation electrode 14. The partial flow path 421D is provided between the plate 30*b* of the resonator 30D and the excitation electrode 14. The partial flow path 421D extends in the radial direction from the axis AX. The partial flow path 422D is connected to the partial flow path 421D via a plurality of communication holes 42*c* formed in the plate 30*b*. The communication holes 42*c* penetrate the plate 30*b* and are arranged along the circumferential direction around the axis AX. The partial flow path 422D extends alternately in opposite directions between the plurality of fans 40 and the partial flow path 421D. The opposite directions are the direction toward the axis AX and the direction away from the axis AX. The opposite directions are perpendicular to the axis AX.

The partial flow path 423D is provided inward of the inner periphery 30*i* of the resonator 30D. The partial flow path 423D may have the axis AX as a central axis thereof. That is, the partial flow path 423D may extend in the vertical direction to the partial flow path 421D along the axis AX.

In the plasma processing apparatus 1D, the heat medium is supplied from the fans 40 to the partial flow path 421D via the openings 42*b* and the partial flow path 422D and flows along the upper surface of the excitation electrode 14 in the partial flow path 421D. As a result, heat exchange occurs between the excitation electrode 14 and the heat medium. Then, the heat medium flows from the partial flow path 421D to the partial flow path 423D. The heat medium is discharged from the partial flow path 423D to the outside of the plasma processing apparatus 1 via the opening 42*a*.

In one embodiment, the partial flow path 422D of the temperature regulator 18D may be formed with the cavity 32D of the resonator 30D. In this case, the resonator 30D constitutes a heat exchanger for the excitation electrode 14.

In one embodiment, a vertical length (height) of a cavity in an uppermost layer among the plurality of layers in the cavity 32D may be longer than vertical lengths (heights) of cavities in any other layers among the plurality of layers.

In one embodiment, the upper wall 30*u* of the resonator 30D may have a plurality of fins 30*f*. The fins 30*f* protrude upward. The fins 30*f* extend in the radial direction with respect to the axis AX and are arranged along the circumferential direction around the axis AX. A heat-insulating plate 80 may be disposed on the fins 30*f*. The heat-insulating plate 80 is made of polyimide, for example.

The fins 30*f* provide a plurality of flow paths thereamong. The flow paths provided by the fins 30*f* extend in the radial direction with respect to the axis AX and are arranged along the circumferential direction around the axis AX. The partial flow path 423D and the opening 42*a* are connected to each other via the flow paths provided by the fins 30*f*. According to this embodiment, the heat medium is cooled by the fins 30*f* and is then discharged to the outside of the plasma processing apparatus 1D via the opening 42*a*.

While various exemplary embodiments have been described above, various additions, omissions, substitutions, and modifications may be made without being limited to the exemplary embodiments described above. Further, elements from different embodiments may be combined to form other embodiments.

Here, various exemplary embodiments included in the present disclosure will be described in the following [E1] to [E16].

[E1]

A plasma processing apparatus including:

a chamber providing a processing space therein;

a substrate support provided in the processing space;

an excitation electrode provided above the substrate support;

an emitter provided to emit electromagnetic waves to a plasma generation space below the excitation electrode, and extending around a central axis of the chamber and the excitation electrode; and a temperature regulator configured to supply a heat medium along an upper surface of the excitation electrode, wherein the temperature regulator includes a plurality of fans configured to create a flow of the heat medium, and provides a flow path for the heat medium between each of the plurality of fans and the excitation electrode, wherein the plurality of fans is arranged above the excitation electrode at equal intervals around the central axis, wherein the flow path is axially or rotationally symmetrical with respect to the central axis, and includes:

a first partial flow path extending along the upper surface of the excitation electrode; and a second partial flow path extending alternately in opposite directions between the plurality of fans and the first partial flow path.

[E2]

The plasma processing apparatus of E1, further including a resonator including a first end and a second end, providing a cavity extending from the first end to the second end, configured to resonate electromagnetic waves propagating via the cavity by reflecting the electromagnetic waves at the first end and the second end, and provided above the excitation electrode, wherein the first end is located above the second end and extends in a circumferential direction around the central axis, wherein the emitter is disposed to receive the electromagnetic waves from the second end, and wherein the second partial flow path is formed with the cavity.

[E3]

The plasma processing apparatus of E2, further including a conductor provided between the resonator and the excitation electrode to form a gap between the resonator and the excitation electrode, and configured to electrically connect the resonator and the excitation electrode to each other.

[E4]

The plasma processing apparatus of E2 or E3, wherein the cavity and the flow path of the temperature regulator extend alternately in a direction toward the central axis and in a direction away from the central axis to form a plurality of layers.

[E5]

The plasma processing apparatus of E4, wherein the resonator further includes an outer periphery, wherein the outer periphery includes a plurality of stages arranged along a vertical direction, and wherein in the outer periphery, one stage of the plurality of stages, other than an uppermost stage and a lowermost stage, is made of an insulating material.

[E6]

The plasma processing apparatus of E5, wherein the one stage is positioned at a location where an antinode of standing waves of the electromagnetic waves is formed in the resonator.

[E7]

The plasma processing apparatus of E5 or E6, wherein the one stage is constituted by a plurality of pillars arranged along the circumferential direction.

[E8]

The plasma processing apparatus of E7, wherein each of the plurality of stages, other than the one stage, is constituted by a plurality of metallic pillars arranged along the circumferential direction.

[E9]

The plasma processing apparatus of E7 or E8, wherein the resonator further includes a cylindrical and metallic shield thin plate surrounding the outer periphery.

[E10]

The plasma processing apparatus of any one of E4 to E9, further including a plurality of plates forming the plurality of layers and arranged alternately with the plurality of layers, wherein a plurality of slits extending in a radial direction with respect to the central axis and arranged along the circumferential direction is formed in at least one of the plurality of plates.

[E11]

The plasma processing apparatus of any one of E4 to E10, wherein the plurality of fans is connected to an uppermost layer of the plurality of layers, and wherein a vertical length of the uppermost layer is longer than a vertical length of each of all remaining layers among the plurality of layers.

[E12]

The plasma processing apparatus of any one of E2 to E11, wherein the resonator further includes an inner periphery surrounding the central axis, wherein the resonator forms, as a portion of the flow path, a third partial flow path inward of the inner periphery, wherein the third partial flow path is connected to the first partial flow path, wherein the plasma processing apparatus further comprises a heater provided inward of the inner periphery, and wherein the plurality of fans create a flow of the heat medium flowing from the third partial flow path to the second partial flow path via the first partial flow path.

[E13]

The plasma processing apparatus of E12, wherein the excitation electrode includes:

a shower plate provided above the substrate support; and an upper electrode provided on the shower plate and forming a gas diffusion chamber between the shower plate and the upper electrode, wherein the plasma processing apparatus further comprises a gas pipe extending in the vertical direction at a location inward of the inner periphery, wherein the gas pipe is connected to the gas diffusion chamber, and wherein the heater is located inward of the inner periphery and surrounds the gas pipe.

[E14]

The plasma processing apparatus of any one of E2 to E13, wherein the first partial flow path is provided between the resonator and the excitation electrode, wherein the excitation electrode includes a plurality of fins forming the first partial flow path, and wherein the plurality of fins extends in the radial direction with respect to the central axis and is arranged along the circumferential direction.

[E15]

The plasma processing apparatus of any one of E1 to E14, wherein the excitation electrode incorporates the heater in the excitation electrode.

[E16]

The plasma processing apparatus of any one of E1 to E15, wherein the temperature regulator further includes a cooler into which a coolant is supplied, and wherein the cooler forms a portion of the second partial flow path.

According to one exemplary embodiment, uniformity of a flow of a heat medium, which is for adjusting a temperature of an excitation electrode in a plasma processing apparatus, in a circumferential direction is improved.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A plasma processing apparatus comprising:

a chamber providing a processing space therein;

a substrate support provided in the processing space;

an excitation electrode provided above the substrate support;

an emitter provided to emit electromagnetic waves to a plasma generation space below the excitation electrode, and extending around a central axis of the chamber and the excitation electrode; and a temperature regulator configured to supply a heat medium along an upper surface of the excitation electrode, wherein the temperature regulator includes a plurality of fans configured to create a flow of the heat medium, and provides a flow path for the heat medium between each of the plurality of fans and the excitation electrode, wherein the plurality of fans is arranged above the excitation electrode at equal intervals around the central axis, wherein the flow path is axially or rotationally symmetrical with respect to the central axis, and includes:

a first partial flow path extending along the upper surface of the excitation electrode; and a second partial flow path extending alternately in opposite directions between the plurality of fans and the first partial flow path.

2. The plasma processing apparatus of claim 1, further comprising a resonator including a first end and a second end, providing a cavity extending from the first end to the second end, configured to resonate electromagnetic waves propagating via the cavity by reflecting the electromagnetic waves at the first end and the second end, and provided above the excitation electrode, wherein the first end is located above the second end and extends in a circumferential direction around the central axis, wherein the emitter is disposed to receive the electromagnetic waves from the second end, and wherein the second partial flow path is formed with the cavity.

3. The plasma processing apparatus of claim 2, wherein the cavity and the flow path of the temperature regulator extend alternately in a direction toward the central axis and in a direction away from the central axis to form a plurality of layers.

4. The plasma processing apparatus of claim 3, wherein the resonator further includes an outer periphery, wherein the outer periphery includes a plurality of stages arranged along a vertical direction, and wherein in the outer periphery, one stage of the plurality of stages, other than an uppermost stage and a lowermost stage, is made of an insulating material.

5. The plasma processing apparatus of claim 4, wherein the one stage is constituted by a plurality of pillars arranged along the circumferential direction.

6. The plasma processing apparatus of claim 5, wherein each of the plurality of stages, other than the one stage, is constituted by a plurality of metallic pillars arranged along the circumferential direction.

7. The plasma processing apparatus of claim 6, wherein the resonator further includes an inner periphery surrounding the central axis, wherein the resonator forms, as a portion of the flow path, a third partial flow path inward of the inner periphery, wherein the third partial flow path is connected to the first partial flow path, wherein the plasma processing apparatus further comprises a heater provided inward of the inner periphery, and wherein the plurality of fans creates a flow of the heat medium flowing from the third partial flow path to the second partial flow path via the first partial flow path.

8. The plasma processing apparatus of claim 7, wherein the excitation electrode includes:

a shower plate provided above the substrate support; and an upper electrode provided on the shower plate and forming a gas diffusion chamber between the shower plate and the upper electrode, wherein the plasma processing apparatus further comprises a gas pipe extending in the vertical direction at a location inward of the inner periphery, wherein the gas pipe is connected to the gas diffusion chamber, and wherein the heater is located inward of the inner periphery and surrounds the gas pipe.

9. The plasma processing apparatus of claim 5, wherein the resonator further includes a cylindrical and metallic shield thin plate surrounding the outer periphery.

10. The plasma processing apparatus of claim 4, wherein the one stage is positioned at a location where an antinode of standing waves of the electromagnetic waves is formed in the resonator.

11. The plasma processing apparatus of claim 3, further comprising a plurality of plates forming the plurality of layers and arranged alternately with the plurality of layers, wherein a plurality of slits extending in a radial direction with respect to the central axis and arranged along the circumferential direction is formed in at least one of the plurality of plates.

12. The plasma processing apparatus of claim 3, wherein the plurality of fans is connected to an uppermost layer of the plurality of layers, and wherein a vertical length of the uppermost layer is longer than a vertical length of each of all remaining layers among the plurality of layers.

13. The plasma processing apparatus of claim 2, further comprising a conductor provided between the resonator and the excitation electrode to form a gap between the resonator and the excitation electrode, and configured to electrically connect the resonator and the excitation electrode to each other.

14. The plasma processing apparatus of claim 2, wherein the resonator further includes an inner periphery surrounding the central axis, wherein the resonator forms, as a portion of the flow path, a third partial flow path inward of the inner periphery, wherein the third partial flow path is connected to the first partial flow path, wherein the plasma processing apparatus further comprises a heater provided inward of the inner periphery, and wherein the plurality of fans creates a flow of the heat medium flowing from the third partial flow path to the second partial flow path via the first partial flow path.

15. The plasma processing apparatus of claim 2, wherein the first partial flow path is provided between the resonator and the excitation electrode, wherein the excitation electrode includes a plurality of fins forming the first partial flow path, and wherein the plurality of fins extends in a radial direction with respect to the central axis and is arranged along the circumferential direction.

16. The plasma processing apparatus of claim 1, wherein the excitation electrode incorporates a heater in the excitation electrode.

17. The plasma processing apparatus of claim 1, wherein the temperature regulator further includes a cooler into which a coolant is supplied, and wherein the cooler forms a portion of the second partial flow path.

* * * * *